(12) United States Patent
Fujita et al.

(10) Patent No.: US 9,726,563 B2
(45) Date of Patent: Aug. 8, 2017

(54) DEVICE MEMBER INCLUDING CAVITY AND METHOD OF PRODUCING THE DEVICE MEMBER INCLUDING CAVITY

(71) Applicants: The University of Tokyo, Bunkyo-ku, Tokyo (JP); Kabushiki Kaisha Saginomiya Seisakusho, Nakano-ku, Tokyo (JP)

(72) Inventors: Hiroyuki Fujita, Tokyo (JP); Hiroshi Toshiyoshi, Tokyo (JP); Hiroyuki Mitsuya, Sayama (JP)

(73) Assignees: THE UNIVERSITY OF TOKYO, Bunkyo-Ku, Tokyo (JP); KABUSHIKI KAISHA SAGINOMIYA SEISAKUSHO, Nakano-Ku, Tokyo (JP)

( * ) Notice: Subject to any disclaimer, the term of this patent is extended or adjusted under 35 U.S.C. 154(b) by 41 days.

(21) Appl. No.: 14/430,321

(22) PCT Filed: Jun. 18, 2013

(86) PCT No.: PCT/JP2013/066674
§ 371 (c)(1),
(2) Date: Mar. 23, 2015

(87) PCT Pub. No.: WO2014/050229
PCT Pub. Date: Apr. 3, 2014

(65) Prior Publication Data
US 2015/0211949 A1     Jul. 30, 2015

(30) Foreign Application Priority Data

Sep. 25, 2012   (JP) .................... 2012-210578

(51) Int. Cl.
*G01L 9/00*      (2006.01)
*H01L 29/84*     (2006.01)
*B81C 1/00*      (2006.01)

(52) U.S. Cl.
CPC ........ *G01L 9/0073* (2013.01); *B81C 1/00047* (2013.01); *B81C 1/00293* (2013.01);
(Continued)

(58) Field of Classification Search
None
See application file for complete search history.

(56) References Cited

U.S. PATENT DOCUMENTS 6,928,879 B2   8/2005   Partridge et al.
7,629,657 B2   12/2009  Partridge et al.
(Continued)

FOREIGN PATENT DOCUMENTS

EP   1452844 A1    9/2004
JP   3745648 B2    12/2002
JP   2004-260187 A  9/2004

OTHER PUBLICATIONS

International Search Report issued in corresponding PCT application No. PCT/JP2013/066674, mailed Jul. 16, 2013, 8 pages.
(Continued)

*Primary Examiner* — Andre Allen
(74) *Attorney, Agent, or Firm* — Snyder, Clark, Lesch & Chung, LLP

(57) ABSTRACT

A device member including a cavity, includes a base member, an interlayer, an upper layer, an opening portion, and a gas-permeable sealing layer. The base member includes a first semiconductor. The interlayer is formed on the base member and is non-conductive. The upper layer is formed on the interlayer and includes a second semiconductor. The opening portion is formed at the upper layer. The gas-
(Continued)

permeable sealing layer is formed to seal the opening portion formed at the upper layer. The cavity is formed by removing the interlayer with an etching gas that penetrates through the sealing layer.

16 Claims, 15 Drawing Sheets

(52) U.S. Cl.
CPC ............ *G01L 9/0042* (2013.01); *H01L 29/84* (2013.01); *B81B 2201/0264* (2013.01)

(56) References Cited

U.S. PATENT DOCUMENTS

| | | | |
|---|---|---|---|
| 2014/0252508 A1* | 9/2014 | Cheng | B81C 1/00246 257/415 |
| 2015/0375998 A1* | 12/2015 | Kautzsch | B81C 1/00246 257/254 |
| 2015/0375999 A1* | 12/2015 | Kautzsch | B81C 1/00246 257/254 |
| 2016/0163942 A1* | 6/2016 | Emadi | H01L 35/02 257/467 |

OTHER PUBLICATIONS

International Preliminary Report on Patentability issued in corresponding PCT application No. PCT/JP2013/066674, mailed Apr. 9, 2015, 10 pages.

* cited by examiner

Fig. 2
(A)
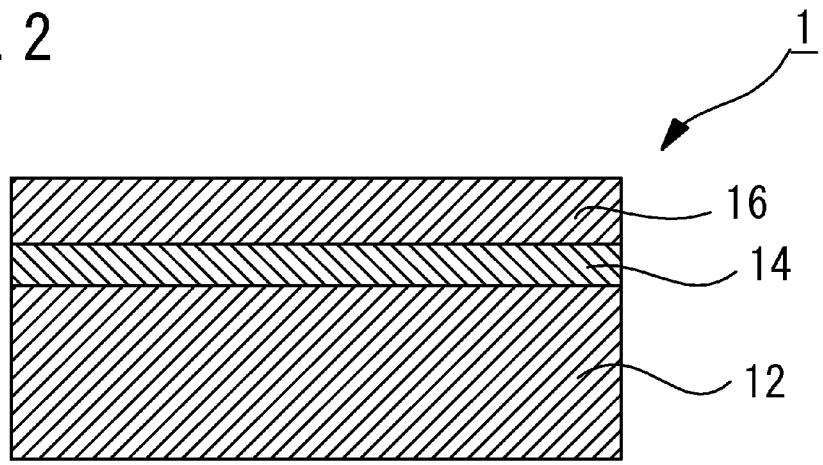
(B)
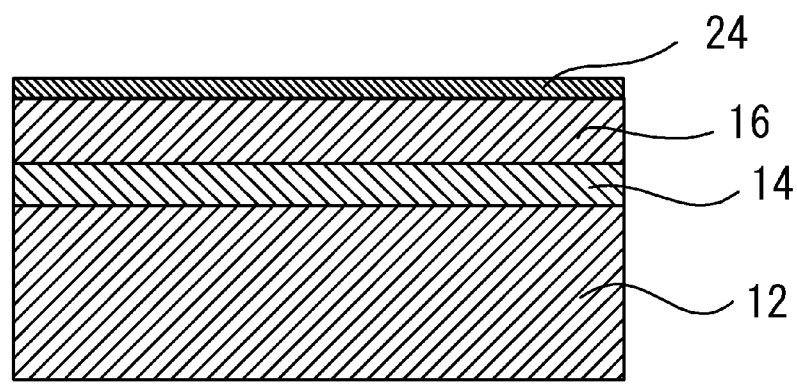
(C)
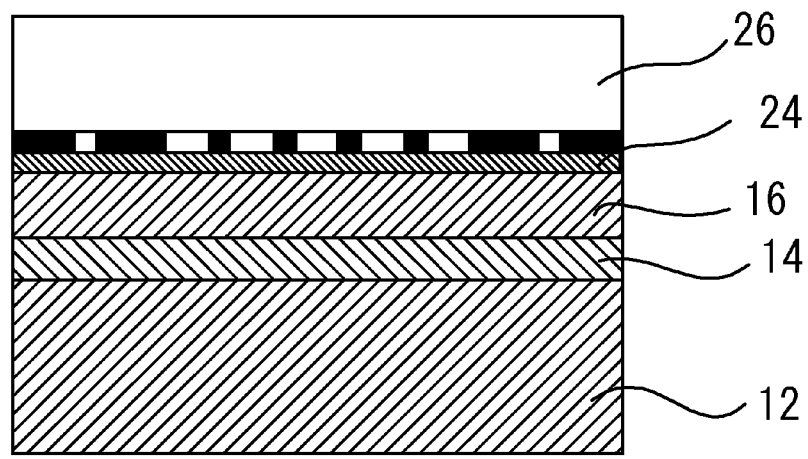

Fig. 4
(A)
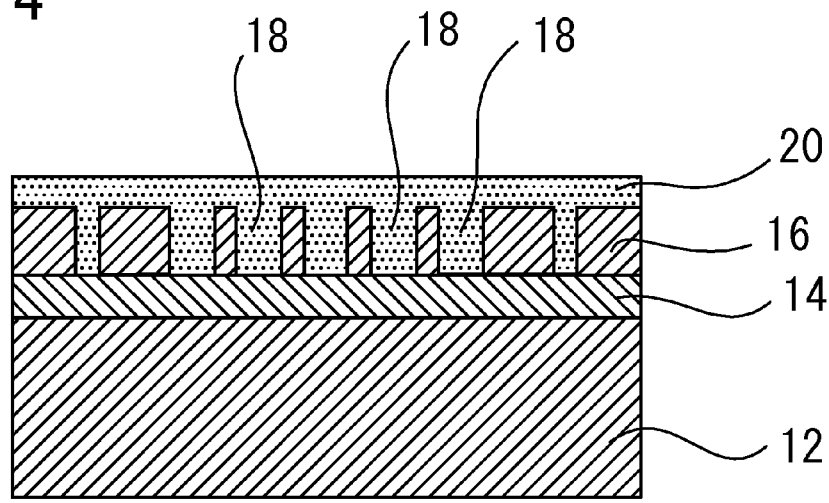
(B)
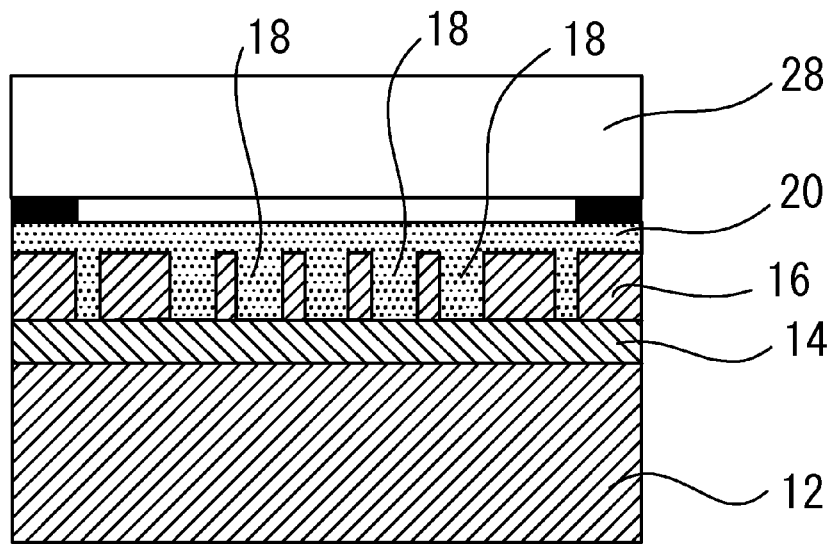
(C)
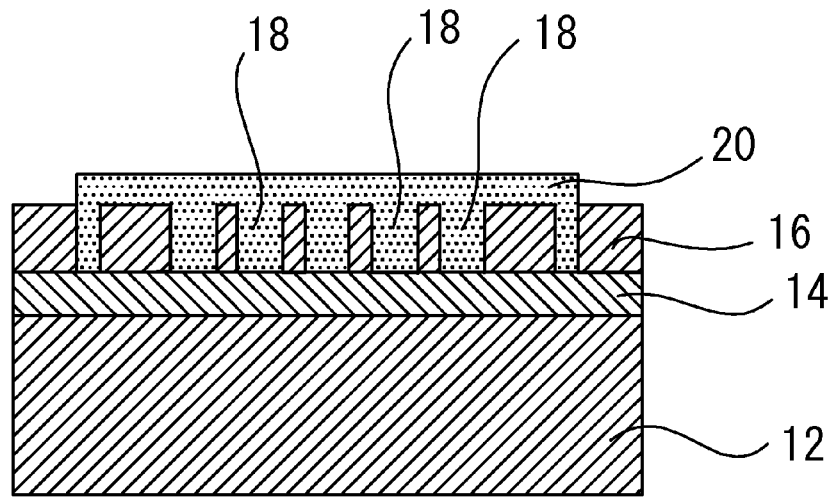

Fig. 7
(A) 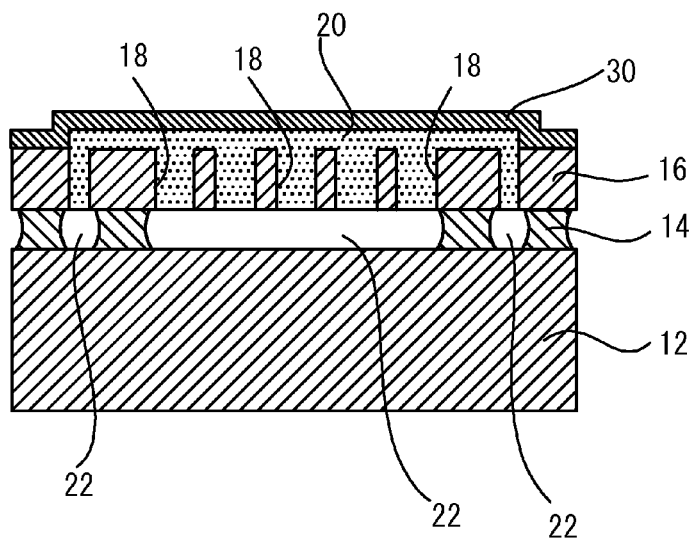
(B) 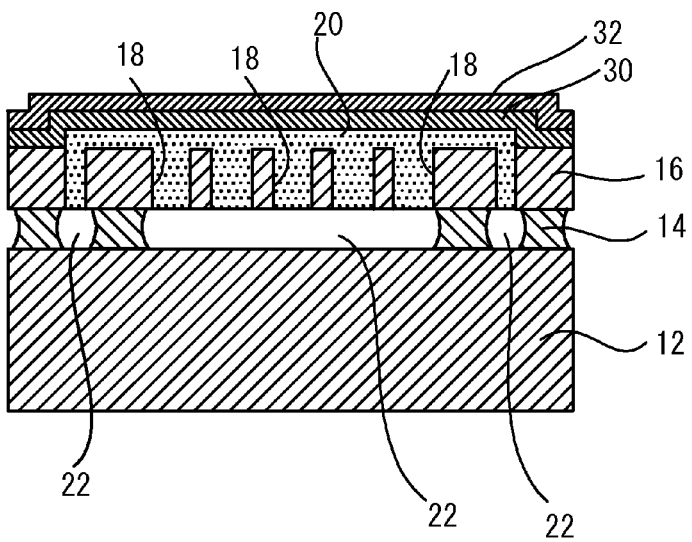
(C) 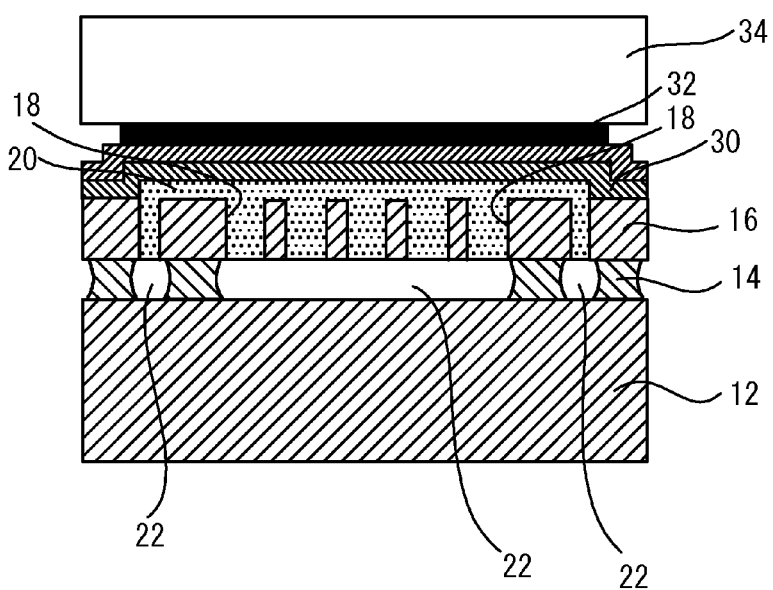

Fig. 8
(A) 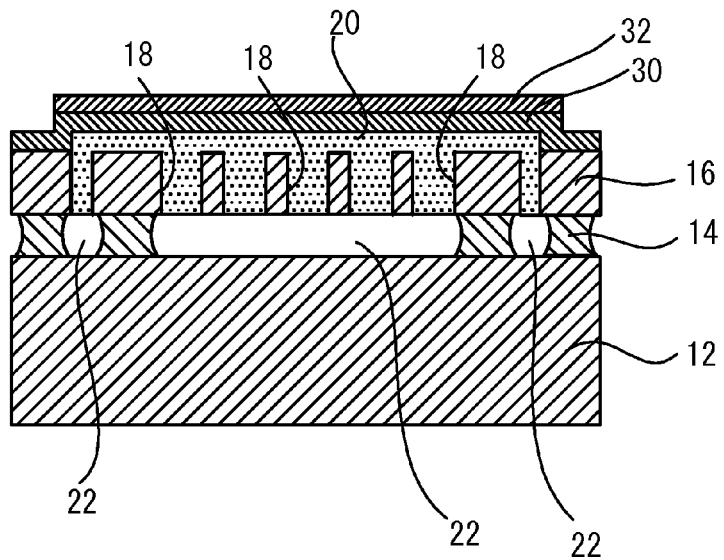
(B) 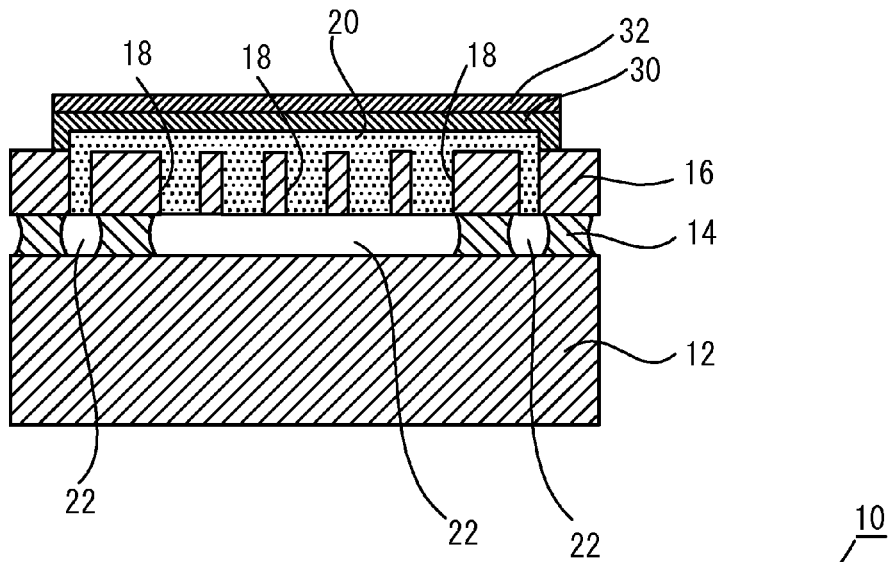
(C) 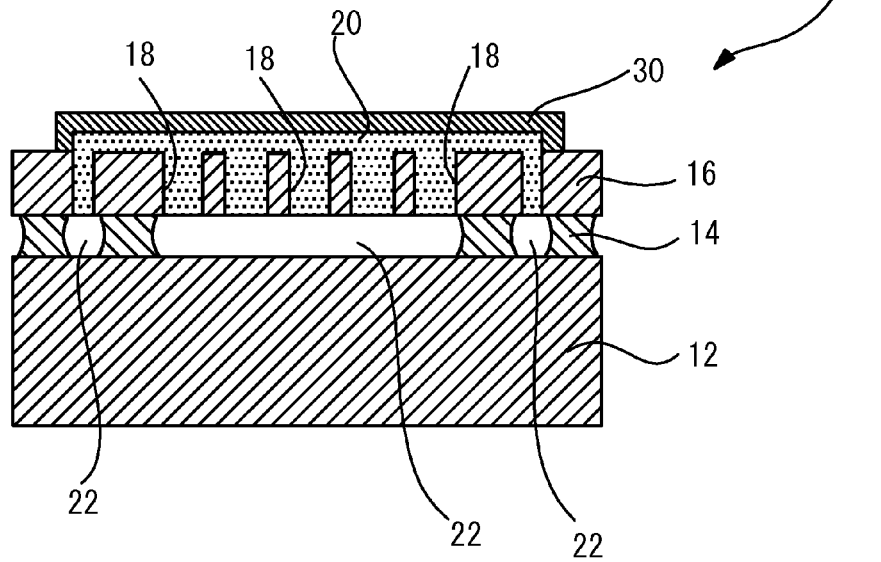

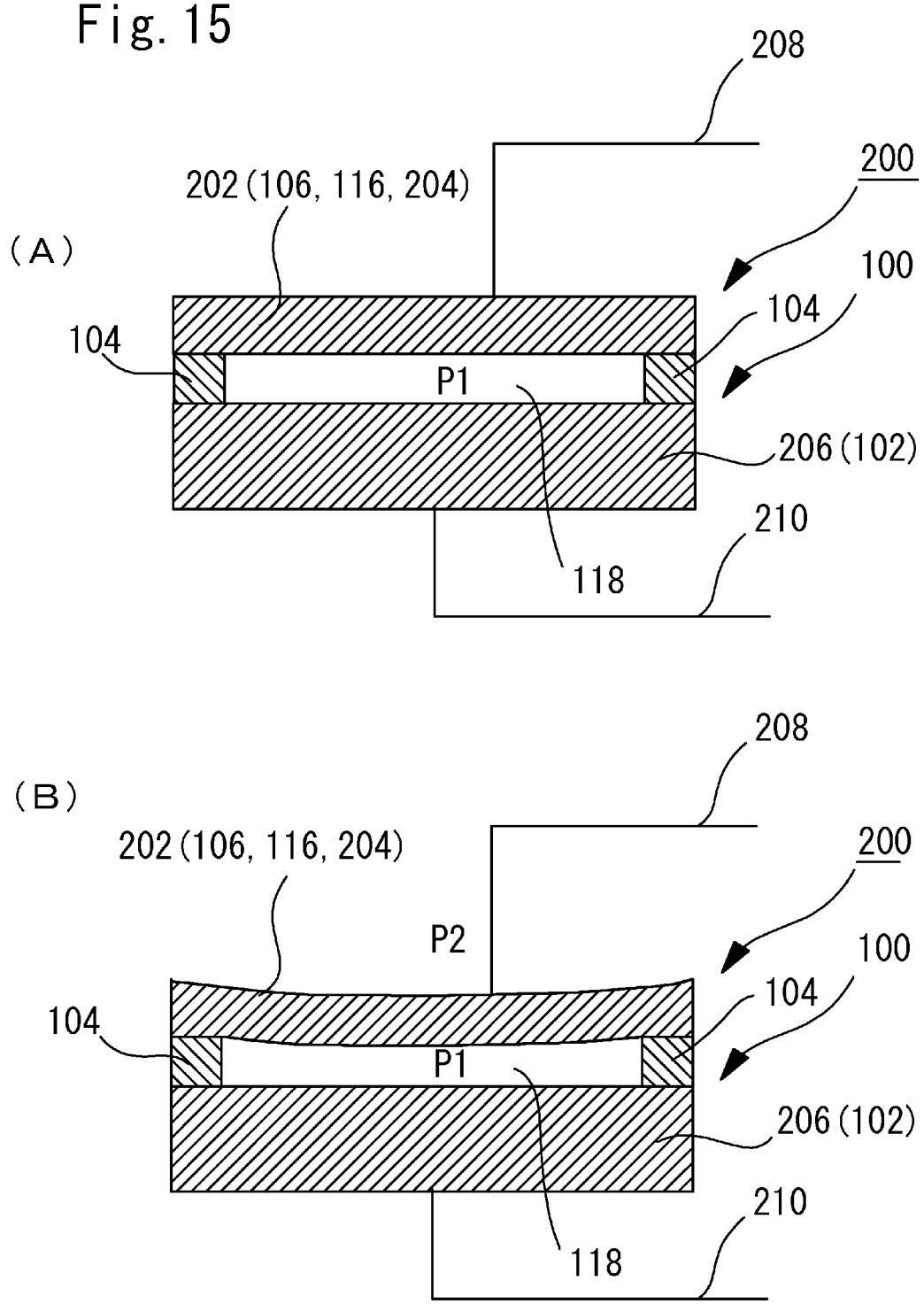

DEVICE MEMBER INCLUDING CAVITY AND METHOD OF PRODUCING THE DEVICE MEMBER INCLUDING CAVITY

TECHNICAL FIELD

The invention belongs to the technical field of MEMS (Micro Electro Mechanical Systems) and relates to a device member comprising cavity and a method of producing the device member comprising cavity.

The device member, in which such a cavity is provided, can be used, for instance, as a micro passage device that is used for the pressure sensor of the capacitance type, the inkjet printer head, the medical treatment, and biotechnology etc.

BACKGROUND ART

The pressure sensor of such a capacitance type is used for various usages, for example, such as refrigerant pressure sensor for freezing, refrigeration, and air-conditioning equipment; hydraulic pressure sensors for water supplies and industrial pumps; vapor pressure sensor for steam boiler; air pressure/oil pressure sensor for air pressure/oil pressure industrial apparatus and pressure sensor for cars.

By the way, conventionally, as a device member, in which this kind of cavity is provided, for instance, as for the pressure sensor of the capacitance type, the producing method disclosed in Patent Document 1 (JP 2004-260187, A) is proposed.

FIG. 9-FIG. 13 is a schematic view showing the process of the method of producing the device member, in which such a conventional cavity is provided.

For instance, as shown in FIG. 9 (A), a device material 101 including the SOI (Silicon On Insulator) wafer, comprising a substrate member 102 including Si, an interlayer 104 including $SiO_2$ formed on this substrate member 102, and an upper layer 106 including Si formed on the interlayer 104, is prepared.

Next, as shown in FIG. 9 (B), for instance, a photoresist layer 108 of the positive type is formed on the upper layer 106.

Moreover, as shown in FIG. 9 (C), through a photomask 110 having the predetermined pattern, the photoresist layer 108 is exposed, for instance, by using ultraviolet (UV) from the upper surface of this photoresist layer 108.

Thereafter, for instance, it is developed by the developer such as TMAH (Tetra Methyl Ammonium Hydroxide).

As a result, as shown in FIG. 10 (A), the photoresist of the exposed portion is removed, so that the photoresist layer 108 is remained in the form of the predetermined pattern.

Under such a condition, as shown in FIG. 10 (B), the photoresist layer 108 is used as a mask and the upper layer 106 is processed by using the method of Deep Reactive RIE (Deep Reactive Ion Etching).

That is to say, for instance, "the process in which the etching by SF6 and the passivation by $C_4F_8$ is alternately are performed", that is called "Process of Bosch" is performed.

As a result, an opening portion 112, which is the same pattern as the photoresist layer 108 remained in the form of the predetermined pattern, is formed to the upper layer 106.

Next, as shown in FIG. 10 (C), all photoresist layers 108 are removed.

Moreover, as shown in FIG. 11 (A), for instance, the interlayer 104 is etched by using the HF gas, so that a gap 114 having the predetermined pattern is formed to the interlayer 104.

Moreover, as shown in FIG. 11(B), from the upper surface in the upper layer 106, for instance, metal such as aluminum, semiconductor such as polysilicon, or plastic such as parylene is deposited, so that a sealing layer 116 is formed.

As a result, a part of sealing layer 116 is entered into the opening portion 112 formed to upper layer 106 and is sealed, so that a cavity 118 is formed.

Next, as shown in FIG. 11 (C), for instance, photoresist layer 120 of the positive type is spin-coated on the upper surface of the sealing layer 116.

Thereafter, as shown in FIG. 12 (A), through a photomask 122 having the predetermined pattern, the photoresist layer 120 is exposed by, for instance, by using ultraviolet (UV) from the upper surface of this photoresist layer 120.

Thereafter, for instance, it is developed by the developer such as TMAH (Tetra Methyl Ammonium Hydroxide).

As a result, as shown in FIG. 12 (B), the photoresist of the exposed portion is removed, so that the photoresist layer 120 is remained in the form of the predetermined pattern.

Next, for instance, where the sealing layer 116 is aluminum, the aluminum etching fluid is used, or where the sealing layer 116 is a plastic, the $O_2$ ashing by using the $O_2$ plasma is used.

As a result, as shown in FIG. 12 (C), an unnecessary portion is removed from the sealing layer 116.

Thereafter, all photoresist layers 120 are removed.

Consequently, as shown in FIG. 13, a device member 100, in which the sealing layer 116 is formed in the form of the predetermined pattern, is obtained.

Though not shown in the drawing, in the device member 100, predetermined circuit, strain gauge (Strain gauge), and counter electrode, etc. are formed to the upper layer 106 according to the usage.

FIG. 15 is a schematic drawing that shows the schematic when the device member 100 manufactured from a conventional producing method is used as a pressure sensor of the capacitance type.

As shown in FIG. 15, in a pressure sensor 200, the upper layer 106, which is sealed by the above-mentioned sealing layer 116, is used as a diaphragm 202.

Moreover, the diaphragm 202 is used as a counter electrode 204.

In addition, the substrate member 102 consisting of Si is used as a counter electrode 206.

Moreover, as shown in FIG. 15 (A), and FIG. 15 (B), when the pressure of the cavity 118 is P1 and the pressure exerted to the diaphragm 202 from the outside is P2, it is a pressure sensor to detect this pressure difference.

Moreover, the cavity 118 is sealed to enter the state of the vacuum in the cavity 118.

As a result, a pressure sensor of the absolute pressure type is composed as a pressure standard room where pressure P1 in the cavity 118 becomes a vacuum.

By the way, capacity C of the general capacitor composed of two electrodes, which are separated mutually through the dielectric substance (insulator), is shown by a formula listed below.

$$C = \varepsilon \cdot \frac{S}{d} \qquad \text{[Formula 1]}$$

In this formula, $\in$ is a dielectric constant of the dielectric substance (insulator) of interelectrode, and S is an area of the electrode, and d is a distance of interelectrode.

As it is clear from this formula, capacity C is proportional to dielectric constant ∈ of the dielectric substance (insulator) of interelectrode and to area S of the electrode respectively, and is in inverse proportion to distance d of interelectrode.

Similarly, the pressure sensor 200 of the capacitance type shown in FIG. 15 (A) and FIG. 15 (B) comprises the counter electrode 204 and counter electrode 206, which is two electrodes separated mutually through the interlayer 104 that is dielectric substance (insulator).

In this case, the counter electrode 204 that composes one of the electrodes is used as the diaphragm 202, which is displaced by the change in the pressure that is exerted to the counter electrode 204.

As a result, the distance d of the interelectrode between the counter electrode 204 that functions as the diaphragm. 202 and the counter electrode 206 that composes the other electrode is changed.

Therefore, as it is clear from the above formula, in the pressure sensor 200 of the capacitance type, the pressure, which is exerted to the counter electrode 204 that functions as the diaphragm 202, is changed.

As a result, the distance d of the interelectrode between the counter electrode 204 and the counter electrode 206 is changed. Accordingly, it can be considered as a variable capacity capacitor, in which capacity C is changed in inverse proportion to the distance d of interelectrode.

Moreover, as shown in FIG. 15 (A) and FIG. 15 (B), a part of a wire 208 is connected to the counter electrode 204 and apart of a wire 210 is connected to the counter electrode 206.

In addition, each other end of these wires 208, 210 are connected to the measuring control device not shown in the drawing.

As a result, through these wire 208 and wire 206, the voltage can be applied to the counter electrode 204 and the counter electrode 206 by the measuring control device.

As a result, as it is clear from the above formula, displacement of the counter electrode 204 by change in pressure which is exerted to the counter electrode 204 that functions as the diaphragm 202 can be perceived as a change in capacity C in inverse proportion to the distance d of interelectrode.

That is, change in the distance d of the interelectrode between the counter electrode 204 and the counter electrode 206 by displacement of the counter electrode 204, can be perceived as a change in capacity C in inverse proportion to the distance d of interelectrode.

Therefore, if the relation between this change in capacity C and the change of the pressure which is exerted to the counter electrode 204 that functions as the diaphragm 202 is previously recognized, the pressure, which is exerted to the counter electrode 204 at that time by measuring capacity C, can be perceived.

As a result, it can be used as a pressure sensor.
The pressure sensor by such a principle is generally called "Pressure sensor of the capacitance type".

Moreover, though not shown in the drawing, as a pressure sensor, besides the pressure sensor of the capacitance type, the pressure sensor of the piezoresistance type is existed.

In this pressure sensor of the piezoresistance type, strain gauge (Strain gauge) is formed on the surface of the diaphragm and the diaphragm is transformed by pressure from the outside, so that the change in electric resistance according to the generated piezoresistance effect is converted into pressure.

PRIOR ART REFERENCE

Patent Document

[Patent Document 1]
JP, 2004-260187, A

SUMMARY OF INVENTION

Problems to be Solved by the Invention

However, in the producing method of the device member comprising the cavity described in conventional Patent Document 1, as shown in FIG. 13, the enclosing material invades in the gap 114 (see reference numeral 124), and the gap 114 might be buried.

As a result, there is a case that the cavity 118 which has the predetermined shape to be aimed cannot be formed.

In this specification, "gap 114" means the space formed by removing a part of the interlayer before it is sealed by the enclosing material.

In addition, "cavity 118" means the space formed after it is sealed by the sealing layer 116.

In this case, for instance, when using it as a device member of the pressure sensor of the capacitance type, it is difficult to form the diaphragm structure to have the cavity 118 having the predetermined shape internally.

The predetermined capacitance change according to the change of pressure cannot be measured.

As a result, the pressure sensor of high accuracy cannot be provided.

Moreover, the enclosing material should be prevented from invading in the gap 114 as much as possible to avoid such a state. Therefore, in the conventional producing method of the device member comprising the cavity 118, the sealing layer 116 should have been formed by rigid conditions.

Moreover, the production cost cannot help rising since the complicate step is necessary.

In view of considering such a current state, the object of the invention is to provide the device member that has an expected function and the method of producing thereof, in which, such as the conventional method of producing the device member comprising a cavity, an unnecessary enclosing material is not invaded in the gap, and the gap might not be buried, and the cavity which has the predetermined shape to be aimed can be formed by an easy step.

Moreover, the invention is to provide the pressure sensor of high accuracy, in which, in case using it as a device member of the pressure sensor of the capacitance type, the diaphragm structure to have the cavity of the predetermined shape internally can be obtained, and the predetermined capacitance change according to the change of pressure can be measured.

Solution to Problem

The invention was invented to solve the problems and to achieve the object in the above-mentioned prior art,
the device member of the invention is a device member comprising a cavity comprising:
a base member including the semiconductor,
an interlayer, which is formed on the base member and has the nonconductivity,
an upper layer, which is formed on the interlayer and includes the semiconductor,
an opening portion formed to the upper layer, a gas-permeable sealing layer, which is formed to seal the opening portion formed to the upper layer, wherein the cavity is a cavity which is formed by removing the interlayer with an etching gas that is penetrated through the sealing layer.

Moreover, the method of producing the device member of the invention is a method of producing the device member comprising a cavity comprising:

a step of preparing a device material, the device material comprising, a base member including the semiconductor, an interlayer which is formed on the base member and has the nonconductivity, and an upper layer which is formed on the interlayer and includes the semiconductor;

a step of forming an opening portion to the upper layer;

a step of sealing the opening portion which is formed to the upper layer with a gas-permeable sealing layer; and a step of forming the cavity by removing the interlayer with penetrating an etching gas through the gas-permeable sealing layer.

By composing like this, the opening portion formed to the upper layer is sealed with the gas-permeable sealing layer, so that the etching gas is penetrated through this sealing layer.

As a result, the cavity is formed by removing the interlayer.

In addition, for instance, where the interlayer includes SiO2, if reaction formula with the etching gas is shown as the expression listed below.

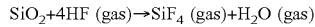

$$SiO_2 + 4HF\ (gas) \rightarrow SiF_4\ (gas) + H_2O\ (gas)$$

Therefore, if consider the case where the pressure sensor of the absolute pressure type is produced by the SOI (Silicon On Insulator) wafer, this sealing layer is desirable that gassy $SiF_4$ and $H_2O$ is penetrated thereinto, besides condition that HF gas that is etching gas should be penetrated absolutely in this sealing layer.

That is, it is desirable that this sealing layer has the gas permeability, in which the gas generated by etching the interlayer having nonconductivity with the etching gas can be also penetrated.

Therefore, such as the conventional method of producing the device member comprising the cavity, the enclosing material is not invaded in the gap, and the gap might not be buried.

As a result, the cavity which has the predetermined shape to be aimed can be formed by an easy step and the device member that has an expected function can be provided.

Moreover, when the opening portion, which is formed to the upper layer, is sealed with the gas-permeable sealing layer, for instance, the enclosing material is spin-coated by using the liquid photoresist as for the enclosing material.

As a result, the enclosing material is entered into the opening portion by the capillary action of the liquid and all part of the opening portion is sealed.

Therefore, the sealing layer need not be formed by rigid conditions conventionally.

Moreover, the complicate step is unnecessary, and the manufacturing cost can be reduced.

Furthermore, the device member of an excellent extremely stable quality can be provided.

Moreover, the device member of the invention is characterized in that a gas-impermeable overcoating layer is provided on the sealing layer.

Moreover, the method of producing the device member of the invention is characterized in that a step of forming the gas-impermeable overcoating layer is included.

By composing like this, since the gas-impermeable overcoating layer is provided on the sealing layer, the gas would not be invaded in the cavity of the device member from the outside, so that it is never polluted in the cavity.

Moreover, the ingress or egress of the gas in the cavity is not also occurred, so that the internal pressure in the cavity is not changed.

Therefore, the device member that has an expected function can be provided.

Moreover, the device member of the invention is characterized in that the cavity is in the state of the vacuum.

Moreover, the method of producing the device member of the invention is characterized in that, a step of forming the gas-impermeable overcoating layer is performed under the vacuum condition, so that the cavity is to be a state of the vacuum.

In this case, "vacuum" is meant that, comprising absolute vacuum state, absolutely near the vacuum state, or decompressed state compared with the atmospheric pressure to the extent that it can be used as a pressure sensor.

By composing like this, in the conventional method of producing the device member, the vacuum chamber is formed by using LPCVD (Low Pressure Chemical Vapor Deposition) or by burning the hydrogen that remains in the cavity.

Therefore, for instance, the device material including the SOI (Silicon On Insulator) wafer etc. had to be made at a high temperature.

Therefore, the material without the resistance to the high temperature cannot be used.

The material is limited, and there is a problem of the lack of generality and versatility etc.

On the contrary, according to the invention, in order to make the cavity to the vacuum, for instance, a very easy process of vacuum evaporation etc. of the metal is used, so that the gas-impermeable overcoating layer can be formed on the sealing layer.

In addition, the device member comprising the pressure standard room, in which an impure gas etc. is not remained in the cavity, and which is sealed in the state of the vacuum, can be provided.

Therefore, for instance, the pressure sensor etc. of the absolute pressure type of the capacitance type can be easily manufactured at low cost.

Moreover, the pressure sensor etc. which has the stable quality compared with conventional can be manufactured.

Moreover, the device member of the invention is characterized in that the base member is Si, the interlayer is $SiO_2$, and the upper layer is Si.

Moreover, the method of producing the device member of the invention is characterized in that the device member is SOI (Silicon On Insulator) wafer, in which the base member is Si, the interlayer is $SiO_2$, and the upper layer is Si.

Thus, in the invention, the SOI (Silicon On Insulator) wafer, in which the base member is Si, the interlayer is $SiO_2$, and the upper layer is Si, is as the device material.

In such a SOI (Silicon On Insulator) wafer, in the wafer manufacturing process, the thickness of the interlayer of $SiO_2$ (that is, the gap between the base member and the upper layer) can be easily constant.

Therefore, $SiO_2$ that is the interlayer is removed by using such a SOI (Silicon On Insulator) wafer as the device material.

As a result, in the cavity forming, the difference of the gap between the base member and the upper layer is small and the cavity of a uniform gap can be formed.

In addition, concerning the SOI (Silicon On Insulator) wafer, a large amount of the SOI wafer of the uniform quality can be obtained and has generality and versatility.

As a result, the producing method is easily, so that the manufacturing cost can be reduced.

Moreover, because the upper layer is Si, in the step of forming the opening portion to the upper layer, for instance, the pattern that includes the portion exposed and the portion not exposed is formed by the photolithography.

In addition, after developing, the etching processing is performed by using the method of Deep RIE (Deep Reactive Ion Etching).

Consequently, the opening portion can be formed to the upper layer.

Therefore, because the photolithography is used, the patterning is easy.

As a result, by using this pattern, the predetermined pattern can be formed to the upper layer with a large amount of excellent reproducibilities.

Moreover, because the interlayer is $SiO_2$, the opening portion formed to the upper layer is sealed in a gas-permeable sealing layer and for instance, the etching gas that includes the HF gas is penetrated through this gas-permeable sealing layer.

As a result, the cavity can be easily formed by removing the interlayer.

Therefore, the complicate step is unnecessary, and the manufacturing cost can be reduced.

Furthermore, the device member of an excellent extremely stable quality can be provided.

Moreover, the invention is a pressure sensor of the capacitance type wherein any one of the device member described above is used.

Moreover, the invention is a pressure sensor of the capacitance type wherein the device member obtained by any one of the method of producing the device member described above is used.

By composing like this, the pressure sensor of high accuracy can be provided, in which in case using it as a device member of the pressure sensor of the capacitance type, the diaphragm structure having the cavity of the predetermined shape internally can be obtained, and the predetermined capacitance change according to the change of pressure can be measured.

Advantageous Effects of Invention

According to the invention, the opening portion formed to the upper layer is sealed with the gas-permeable sealing layer, so that the etching gas is penetrated through this sealing layer.

As a result, the cavity is formed by removing the interlayer.

Therefore, such as the conventional method of producing the device member comprising the cavity, the enclosing material is not invaded in the gap, and the gap might not be buried.

As a result, the cavity which has the predetermined shape to be aimed can be formed by an easy step and the device member that has an expected function can be provided.

Moreover, when the opening portion, which is formed to the upper layer, is sealed with the gas-permeable sealing layer, for instance, the enclosing material is spin-coated by using the liquid photoresist as for the enclosing material.

As a result, the enclosing material is entered into the opening portion by the capillary action of the liquid and the opening portion is sealed, so that the entire opening portion is sealed with the enclosing material of the gas permeability.

Therefore, the sealing layer need not be formed by rigid conditions conventionally.

Moreover, the complicate step is unnecessary, and the manufacturing cost can be reduced.

Furthermore, the device member of an excellent extremely stable quality can be provided.

BRIEF DESCRIPTION OF DRAWINGS

FIG. 2 is a partial enlarged sectional view in which the method of producing the device member comprising the cavity of the invention is explained.

FIG. 4 is a partial enlarged sectional view in which the method of producing the device member comprising the cavity of the invention is explained.

FIG. 7 is a partial enlarged sectional view in which the method of producing the device member comprising the cavity of the invention is explained.

FIG. 8 is a partial enlarged sectional view in which the method of producing the device member comprising the cavity of the invention is explained.

FIG. 15 is a schematic view that shows the schematic when the device member 100 manufactured by the conventional producing method is used as a pressure sensor of the capacitance type.

DESCRIPTION OF EMBODIMENTS

Figure 1:
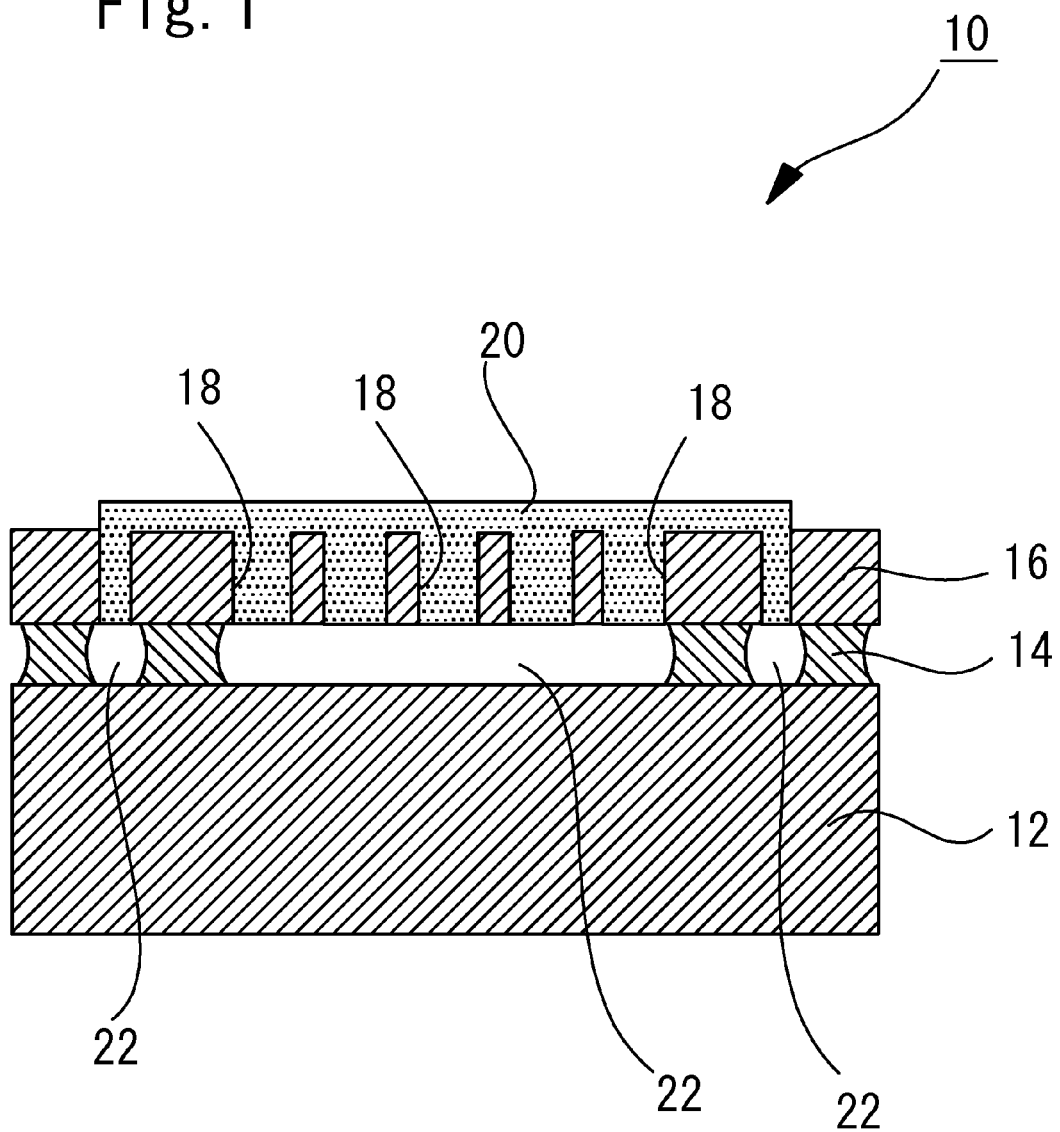
FIG. 1 is a partial enlarged sectional view of the device member comprising the cavity of the invention.

Hereafter, the embodiment of the invention (Embodiment) is described in the detail or more on the basis of the drawing.

Embodiment 1

FIG. 1 is a partial enlarged sectional view of the device member comprising the cavity of the invention.

In FIG. 1, reference numeral 10 shows the device member comprising the cavity of the invention as a whole.

As shown in FIG. 1, the device member 10 of the invention comprises a base member 12 including the semiconductor.

In addition, an interlayer 14 is formed on the base member 12 which has the nonconductivity, Moreover, on this interlayer 14, an upper layer 16 which includes the semiconductor is formed.

In addition, in the upper layer 16, an opening portion 18, which is formed in the state of the predetermined pattern configuration, is provided.

Moreover, a gas-permeable sealing layer 20, which is formed to seal the opening portion 18 formed to the upper layer 16, is provided.

Moreover, as shown in FIG. 1, a cavity 22 is formed to the partial part of the interlayer 14 which is corresponding to this gas-permeable sealing layer 20.

In this case, this cavity 22 is formed by the etching gas which is penetrated through the gas-permeable sealing layer 20.

Moreover, as for the substrate member 12, for instance, the semiconductor such as Si can be used.

It may be elected arbitrarily according to the usage of device member 10, and it is not limited especially.

On the other hand, as for the interlayer 14, it may be used that has nonconductivity and is etched with the etching gas which is penetrated through the gas-permeable sealing layer 20.

It may be elected arbitrarily according to the kind of the etching gas used.

For instance, where the HF gas is selected as the etching gas, for instance, as for the interlayer 14, the oxide etc. such as $SiO_2$ can be used.

In addition, as for the upper layer 16, for instance, the semiconductor such as Si can be used as well as the substrate member 12.

Moreover, it can be selected arbitrarily according to the usage of the device member 10 and it is not especially limited.

Moreover, as for the gas-permeable sealing layer 20, according to the kind of the etching gas used, it can be selected arbitrarily from the one to penetrate this etching gas and it is not especially limited.

For instance, where the HF gas is selected as for the etching gas, such as the photoresist of the negative type "SU-8 (brand name)" made by Microchem company can be used as the gas-permeable sealing layer 20.

In addition, for instance, where the interlayer 14 includes $SiO_2$, if the cavity forming with the etching gas is shown by reaction formula, it is expressed like a formula listed below.

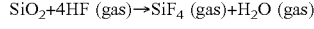

$$SiO_2 + 4HF \text{ (gas)} \rightarrow SiF_4 \text{ (gas)} + H_2O \text{ (gas)}$$

Therefore, if consider the case where the pressure sensor of the absolute pressure type is produced by the SOI (Silicon On Insulator) wafer, as for the sealing layer 20, besides condition that HF gas which is etching gas should penetrate absolutely, it is desirable that gassy $SiF_4$ and $H_2O$ can be penetrated through the sealing layer 20.

That is, it is desirable that the sealing layer 20 has gas-permeable, in which the gas generated when interlayer 14 is etched with the etching gas can be penetrated.

Like this, in the invention, "gas-permeable" of "gas-permeable sealing layer 20" means that all gases, which are generated when the etching gas and the interlayer 14 are etched with the etching gas, can be penetrated.

For instance, where the SOI (Silicon On Insulator) wafer is used as for as the device material and the HF gas is used as the etching gas, as for the gas-permeable requested to the gas-permeable sealing layer 20, for instance, it is desirable that the etching gas include the HF gas and the reactive gases by the etchings such as the $SiF_4$ gas and $H_2O$ gas can be penetrated.

About the method of producing the device member 10 of the invention composed like this, in accordance with FIG. 2-FIG. 5, explanation is described as follows.

First of all, as shown in FIG. 2 (A), a device material 1 that includes the SOI (Silicon On Insulator) wafer is prepared. In this case, the device material 1 comprises, for instance, the substrate member 12 including Si, the interlayer 14 including $SiO_2$ formed on this substrate member 12, and the upper layer 16 including Si formed on the interlayer 14.

Next, as shown in FIG. 2 (B), for instance, a photoresist layer 24 of the positive type is formed on the upper layer 16.

Moreover, as shown in FIG. 2 (C), from the upper surface of this resist layer 24, through a photomask 26 having the predetermined pattern, for instance, the photoresist layer 24 is exposed by ultraviolet (UV).

Thereafter, for instance, it is developed with the developer such as TMAH (Tetra Methyl Ammonium Hydroxide).

Figure 3:
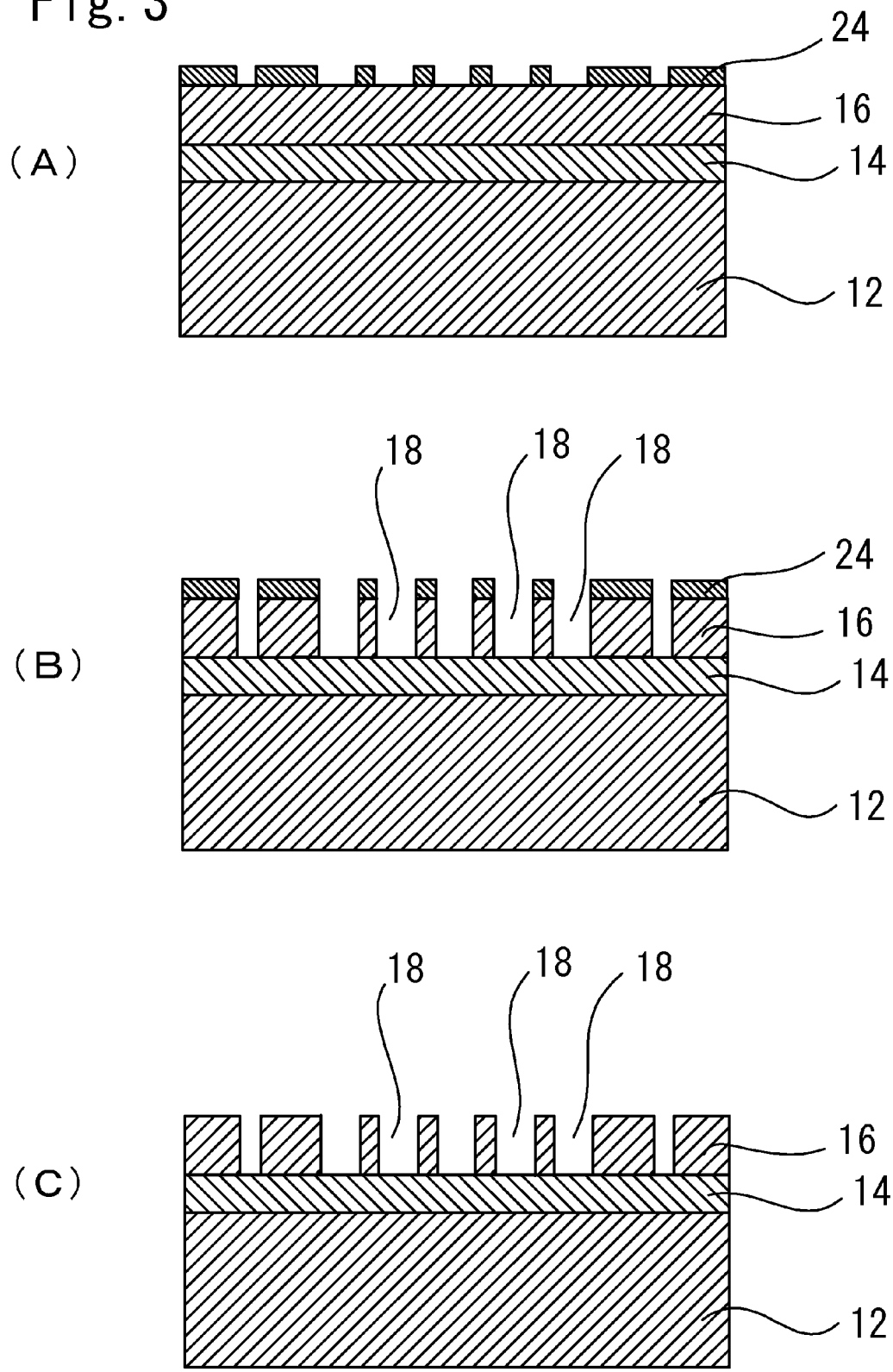
FIG. 3 is a partial enlarged sectional view in which the method of producing the device member comprising the cavity of the invention is explained.

As a result, as shown in FIG. 3 (A), the photoresist of the portion exposed is removed, so that the photoresist layer 24 is remained in the form of the predetermined pattern.

Under such a condition, as shown in FIG. 3 (B), the photoresist layer 24 is used as a mask and the upper layer 16 is processed by using the method of Deep Reactive RIE (Deep Reactive Ion Etching).

That is to say, for instance, "the process in which the etching by $SF_6$ and the passivation by $C_4F_8$ is alternately are performed", that is called "Process of Bosch" is performed.

As a result, an opening portion 18, which is the same pattern as the photoresist layer 24 remained in the form of the predetermined pattern, is formed to the upper layer 16.

Next, as shown in FIG. 3 (C), all photoresist layers 24 are removed.

Moreover, as shown in FIG. 4(A), for instance, enclosing material, which includes the photoresist of the negative type "SU-8 (brand name)" made by Microchem company, is spin-coated on the upper layer 16, so that a gas-permeable sealing layer 20 is formed.

In this case, "SU-8 (brand name)" is originally a liquid, so that "SU-8 (brand name)" is entered into the opening portion 18 by the capillary action of the liquid in the opening portion 18 formed to the upper layer 16 and all part of the opening portion 18 is sealed.

Next, as shown in FIG. 4 (B), "SU-8 (brand name)" is exposed by, for instance, ultraviolet (UV) through photomask 28 having the predetermined pattern.

Moreover, thereafter, after baking at 95° C., it is developed by using, for instance, the developer such as PGMEA (Propylene Glycol Monomethyl Ether Acetate).

As a result, as shown in FIG. 4 (C), "SU-8 (brand name)", which is the enclosing material of the exposed portion, is remained.

Consequently, the gas-permeable sealing layer 20 is remained in the form of the predetermined pattern.

Figure 5:
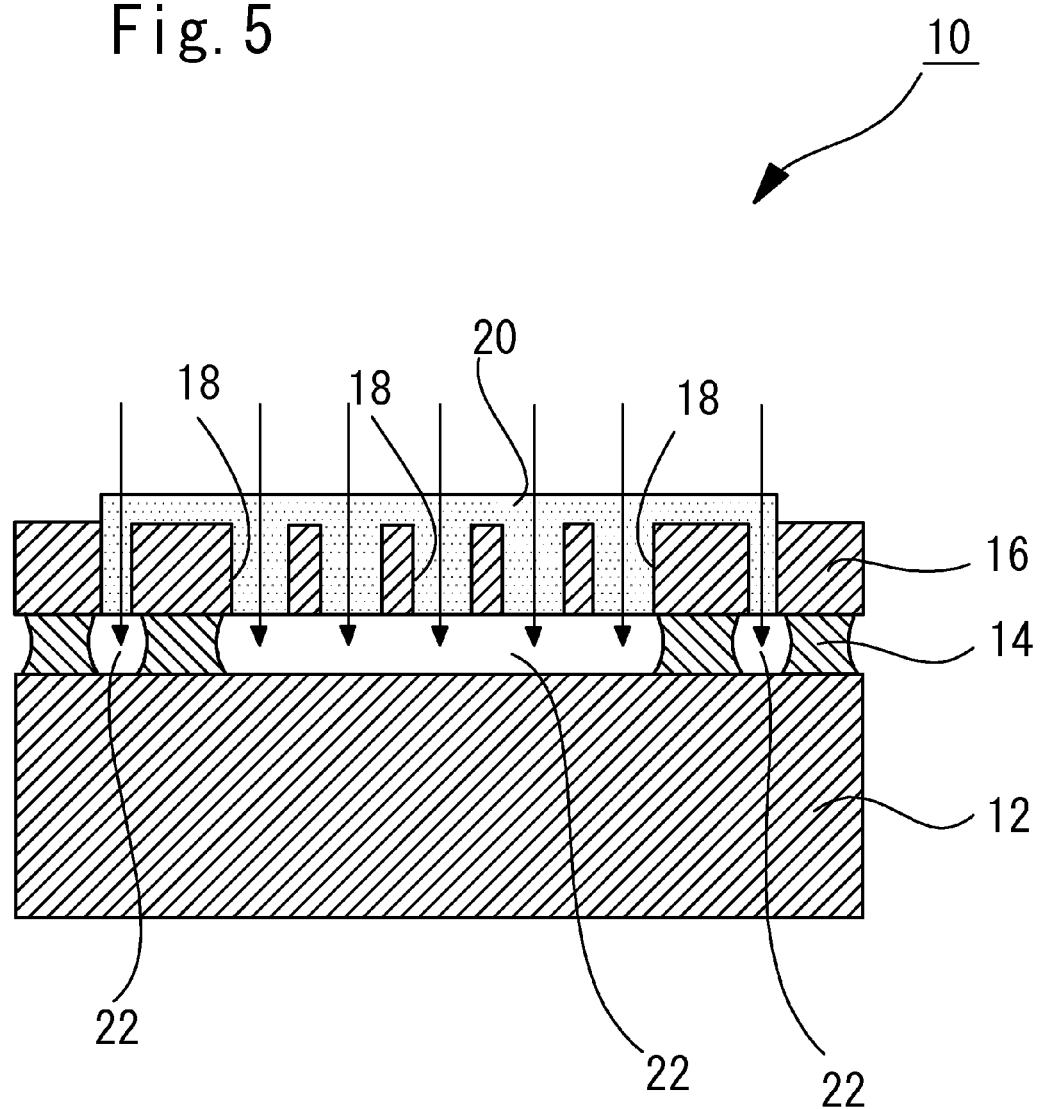
FIG. 5 is a partial enlarged sectional view in which the method of producing the device member comprising the cavity of the invention is explained.

Under such a condition, as shown by the arrow of FIG. 5, the etching gas is penetrated to the gas-permeable sealing layer 20.

As a result, for instance, the HF gas is used and the interlayer 14 is etching-processed, so that a part of the interlayer 14 is removed, and a cavity 22 is formed in the form of the predetermined pattern.

As a result, as shown in FIG. 1, the device member 10, in which the cavity 22 is formed, can be manufactured.

In this case, between the upper layer 16 including Si and the substrate members 12 including Si, the cavity 22 is formed.

Therefore, the upper layer 16 is used as a diaphragm, which is displaced by the change in pressure.

In addition, the upper layer 16 is used as a counter electrode that composes the other electrode.

Moreover, the substrate member 12 is used as a counter electrode that composes the other electrode.

As a result, it can be considered as the variable capacity capacitor.

Figure 14:
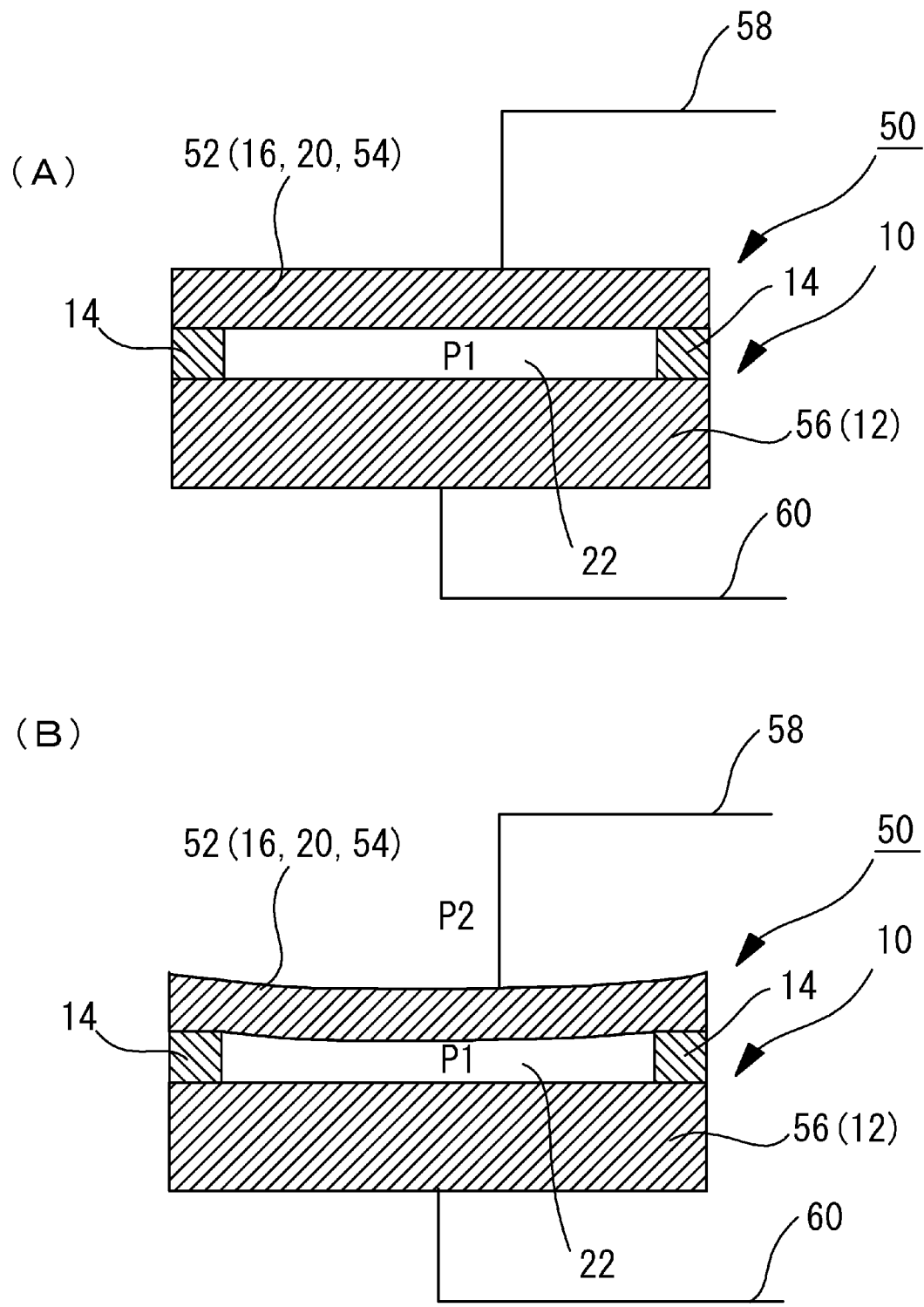
FIG. 14 is a schematic view that shows the schematic when the device member 10 manufactured by the producing method of the invention is used as a pressure sensor of the capacitance type.

FIG. 14 is a schematic view that shows the schematic when the device member 10 manufactured by the producing method of the invention is used as a pressure sensor of the capacitance type.

As shown in FIG. 14, in a pressure sensor 50, the upper layer 16, which is sealed by the above-mentioned sealing layer 20, is used as a diaphragm 52.

Moreover, the diaphragm 52 is used as a counter electrode 54.

In addition, the substrate member 12 that includes Si is also used as a counter electrode 56.

Moreover, as shown in FIG. 14 (A) and FIG. 14 (B), where the pressure of cavity 18 is P1 and the pressure, which is exerted on the diaphragm 52 from the outside, is P2, it is a pressure sensor in which this pressure difference is detected.

Moreover, in order to enter the state of the vacuum in the cavity 18, the cavity 18 is sealed.

As a result, it is a pressure sensor of the absolute pressure type that it is composed as a pressure standard room where pressure P1 in the cavity 18 became a vacuum.

By the way, capacity C of the general capacitor composed of two electrodes, which are separated mutually through the dielectric substance (insulator), is shown by a formula listed below.

$$C = \varepsilon \cdot \frac{S}{d} \quad \text{[formula 2]}$$

In this formula, $\in$ is a dielectric constant of the dielectric substance (insulator) of interelectrode, and S is an area of the electrode, and d is a distance of interelectrode.

As it is clear from this formula, capacity C is proportional to dielectric constant $\in$ of the dielectric substance (insulator) of interelectrode and to area S of the electrode respectively, and is in inverse proportion to distance d of interelectrode.

Similarly, the pressure sensor 50 of the capacitance type shown in FIG. 14 (A) and FIG. 14 (B) comprises the counter electrode 54 and counter electrode 56, which is two electrodes separated mutually through the interlayer 14 that is dielectric substance (insulator).

In this case, the counter electrode 54 that composes one of the electrodes is used as the diaphragm 52, which is displaced by the change in the pressure that is exerted to the counter electrode 54.

As a result, the distance d of the interelectrode between the counter electrode 54 that functions as the diaphragm 52 and the counter electrode 56 that composes the other electrode is changed.

Therefore, as it is clear from the above formula, in the pressure sensor 50 of the capacitance type, the pressure, which is exerted to the counter electrode 54 that functions as the diaphragm 52, is changed.

As a result, the distance d of the interelectrode between the counter electrode 54 and the counter electrode 56 is changed. Accordingly, it can be considered as a variable capacity capacitor, in which capacity C is changed in inverse proportion to the distance d of interelectrode.

Moreover, as shown in FIG. 14 (A) and FIG. 14 (B), a part of a wire 58 is connected to the counter electrode 54 and a part of a wire 60 is connected to the counter electrode 56.

In addition, each other end of these wires 58, 60 are connected to the measuring control device not shown in the drawing.

As a result, through these wire 58 and wire 60, the voltage can be applied to the counter electrode 54 and the counter electrode 56 by the measuring control device.

As a result, as it is clear from the above formula, displacement of the counter electrode 54 by change in pressure which is exerted to the counter electrode 54 that functions as the diaphragm 52 can be perceived as a change in capacity C in inverse proportion to the distance d of interelectrode.

That is, change in the distance d of the interelectrode between the counter electrode 54 and the counter electrode 56 by displacement of the counter electrode 54, can be perceived as a change in capacity C in inverse proportion to the distance d of interelectrode.

Therefore, if the relation between this change in capacity C and the change of the pressure which is exerted to the counter electrode 54 that functions as the diaphragm 52 is previously recognized, the pressure, which is exerted to the counter electrode 54 at that time by measuring capacity C, can be perceived.

As a result, it can be used as a pressure sensor.

The pressure sensor by such a principle is generally called "Pressure sensor of the capacitance type".

Moreover, though not shown in the drawing, as a pressure sensor, besides the pressure sensor of the capacitance type, the invention can be applied to the pressure sensor of the piezoresistance type.

In this pressure sensor of the piezoresistance type, strain gauge (Strain gauge) is formed on the surface of the diaphragm and the diaphragm is transformed by pressure from the outside, so that the change in electric resistance according to the generated piezoresistance effect is converted into pressure.

By composing like this, the opening portion 18 formed to the upper layer 16 is sealed with the gas-permeable sealing layer 20, so that the etching gas is penetrated through this sealing layer 20. As a result, the cavity 22 is formed.

Therefore, such as the conventional method of producing the device member comprising the cavity, the enclosing material is not invaded in the gap, and the gap might not be buried.

As a result, the cavity 22 which has the predetermined shape to be aimed can be formed by an easy step and the device member 10 that has an expected function can be provided.

Moreover, when the opening portion 18, which is formed to the upper layer 16, is sealed with the gas-permeable sealing layer 20, for instance, the enclosing material is spin-coated by using the liquid photoresist as for the enclosing material.

As a result, the enclosing material 20 is entered into the opening portion 18 by the capillary action of the liquid and all part of the opening portion 18 is sealed.

Therefore, the sealing layer need not be formed by rigid conditions conventionally.

Moreover, the complicate step is unnecessary, and the manufacturing cost can be reduced.

Furthermore, the device member 10 of an excellent extremely stable quality can be provided.

In addition, thus, the SOI (Silicon On Insulator) wafer, in which the base member 12 is Si, the interlayer 14 is $SiO_2$, and the upper layer 16 is Si, is as the device material.

In such a SOI (Silicon On Insulator) wafer, in the wafer manufacturing process, the thickness of the interlayer 14 of $SiO_2$ (that is, the gap between the base member 12 and the upper layer 16) can be easily constant.

Therefore, $SiO_2$ that is the interlayer 14 is removed by using such a SOI (Silicon On Insulator) wafer as the device material.

As a result, in the cavity 22 forming, the difference of the gap between the base member 12 and the upper layer 16 is small and the cavity 22 of a uniform gap can be formed.

In addition, concerning the SOI (Silicon On Insulator) wafer, a large amount of the SOI wafer of the uniform quality can be obtained and has generality and versatility As a result, the producing method is easily, so that the manufacturing cost can be reduced.

Moreover, because the upper layer 16 is Si, in the step of forming the opening portion 18 to the upper layer 16, for instance, the pattern that includes the portion exposed and the portion not exposed is formed by the photolithography.

In addition, after developing, the etching processing is performed by using the method of Deep RIE (Deep Reactive Ion Etching).

Consequently, the opening portion 18 can be formed to the upper layer 16.

Therefore, because the photolithography is used, the patterning is easy.

As a result, by using this pattern, the predetermined pattern can be formed to the upper layer 16 with a large amount of excellent reproducibilities.

Moreover, because the interlayer 14 is $SiO_2$, the opening portion 18 formed to the upper layer 16 is sealed in a gas-permeable sealing layer 20.

In addition, the etching gas is penetrated through this gas-permeable sealing layer 20, so that, for instance, the interlayer 14 is etched by using the HF gas.

As a result, the cavity 22 can be easily formed by removing the interlayer 14.

Therefore, the complicate step is unnecessary, and the manufacturing cost can be reduced.

Furthermore, the device member 10 of an excellent extremely stable quality can be provided.

Embodiment 2

Figure 6:
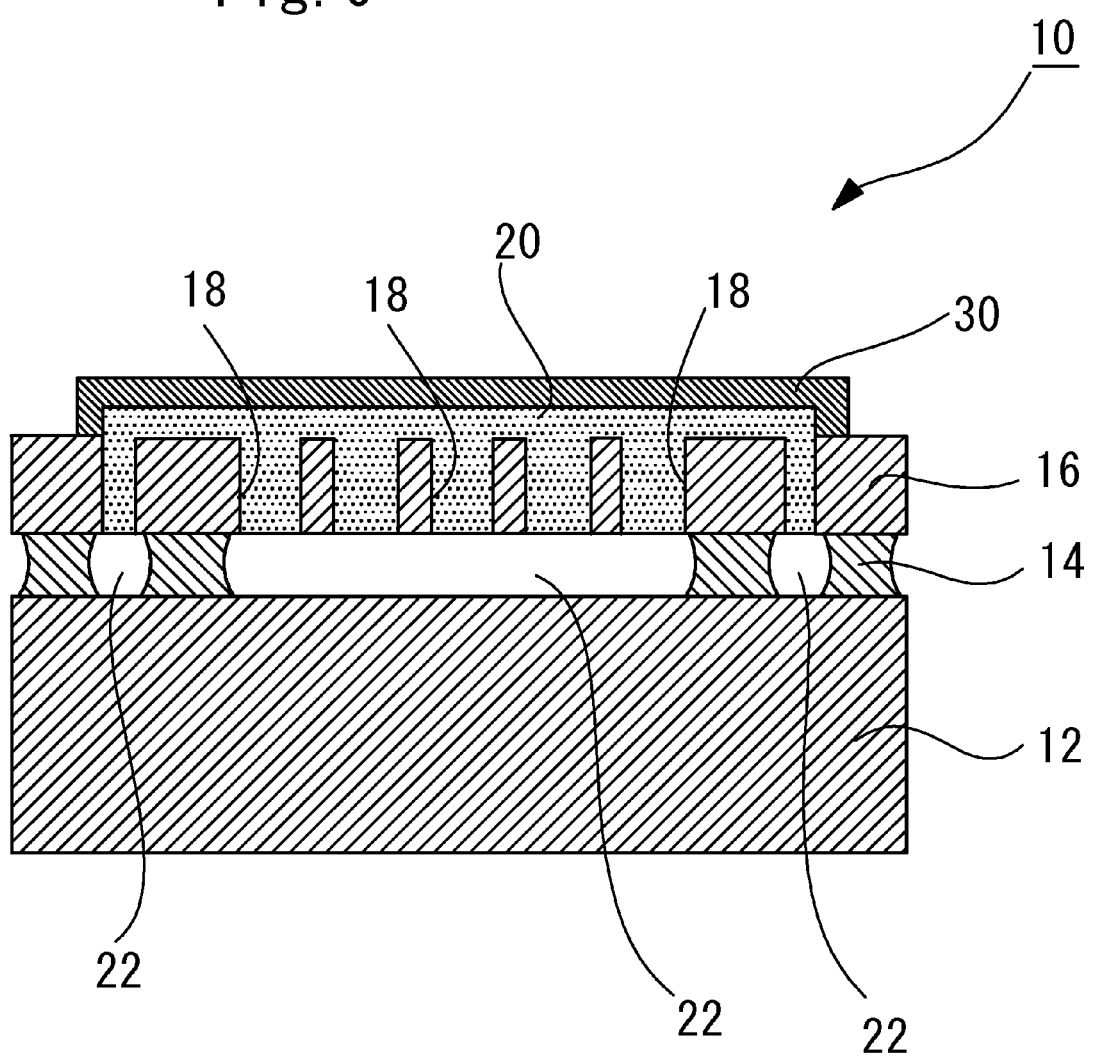
FIG. 6 is a partial enlarged sectional view of another Embodiment of the device member comprising the cavity of the invention.

FIG. 6 is a partial enlarged sectional view of another Embodiment of the device member comprising the cavity of the invention.

The device member 10 of this Embodiment is basically similar composition of the device member 10 shown in FIG. 1.

Like reference numeral is refer to the same composition member, and the detailed explanation is omitted.

In the device member 10 of this Embodiment, as shown in FIG. 6, a gas-impermeable overcoating layer 30 is provided on the gas-permeable sealing layer 20.

In this case, as for the gas-impermeable overcoating layer 30, it may be selected arbitrarily according to the usage of the device member 10 and it is not especially limited.

However, for instance, by the deposition etc., metal such as aluminum, semiconductor such as polysilicon, or plastic such as parylene can be used to form the overcoating layer 30.

In this case, "gas impermeability" of "gas-impermeable overcoating layer 30" means that the gas is not penetrated through the overcoating layer 30 and gas-permeable sealing layer 20, and the gas is not invaded into the cavity 22 from the outside.

As a result, the cavity 22 is not polluted and the ingress or egress of the gas in cavity 22 is not occurred, so that internal pressure in the cavity 22 is not changed.

Moreover, about the film thickness of the overcoating layer 30, it may be selected arbitrarily according to the usage of the device member 10 and it is not especially limited.

However, it is desirable to prevent the gas from invading in the cavity 22 that it is within the range of, for instance, 100 nm-5 µm, preferably 100 nm-200 nm when overcoating layer 30 is aluminum, and 2 µm-5 µm when the overcoating layer 30 is parylene.

According to the device member 10 composed like this, since the gas-impermeable overcoating layer 30 is provided on the sealing layer 20, the gas would not be invaded in the cavity 22 of the device member 10 from the outside, so that it is never polluted in the cavity 22.

Moreover, the ingress or egress of the gas in the cavity is not also occurred, so that the internal pressure in the cavity is not changed.

Therefore, the device member 10 that has an expected function can be provided.

In this case, it is desirable that the cavity 22 is in the state of the vacuum.

That is, it is desirable that a step of forming the gas-impermeable overcoating layer 30 is performed under the vacuum condition, so that the cavity 22 is to be a state of the vacuum.

In this case, "vacuum" is meant that, comprising absolute vacuum state, absolutely near the vacuum state, or decompressed state compared with the atmospheric pressure to the extent that it can be used as a pressure sensor.

By composing like this, in the conventional method of producing the device member, the vacuum chamber is formed by using LPCVD (Low Pressure Chemical Vapor Deposition) or by burning the hydrogen that remains in the cavity.

Therefore, for instance, the device material including the SOI (Silicon On Insulator) wafer etc. had to be made a high temperature.

Therefore, the material without the resistance to the high temperature cannot be used.

The material is limited, and there is a problem of the lack of generality and versatility etc.

On the contrary, according to the invention, in order to make the cavity 22 to the vacuum, for instance, a very easy process of vacuum evaporation etc. of the metal is used, so that the gas-impermeable overcoating layer 30 can be formed on the sealing layer 20.

In addition, the device member 10 comprising the pressure standard room, in which an impure gas etc. is not remained in the cavity 22, and which is sealed in the state of the vacuum, can be provided.

Therefore, for instance, the pressure sensor etc. of the absolute pressure type of the capacitance type can be easily manufactured at low cost.

Moreover, the pressure sensor etc. which has the stable quality compared with conventional can be manufactured.

About the method of producing the device member 10 of the invention composed like this, in accordance with FIG. 7-FIG. 8, explanation is described as follows.

First of all, the step of FIG. 2-FIG. 5 is the same as the method of producing the device member 10 of the above-mentioned Embodiment 1.

As shown in FIG. 5, the etching gas is penetrated to the gas-permeable sealing layer 20, so that a part of the interlayer 14 is removed, and the cavity 22 is formed in the form of the predetermined pattern.

Thereafter, as shown in FIG. 7 (A), on this gas-permeable sealing layer 20, for instance, by the deposition etc., an overcoating layer 30 is formed by using metal such as aluminum, semiconductor such as polysilicon, or plastic such as parylene.

Next, as shown in FIG. 7 (B), for instance, a photoresist layer 32 of the positive type is spin-coated on the overcoating layer 30.

Moreover, as shown in FIG. 7(C), through a photomask 34 having the predetermined pattern, the photoresist layer 32 is exposed, for instance, by using ultraviolet (UV) from the upper surface of this photoresist layer 32.

Thereafter, for instance, it is developed by the developer such as TMAH (Tetra Methyl Ammonium Hydroxide).

As a result, as shown in FIG. 8 (A), the photoresist of the exposed portion is removed, so that the photoresist layer 32 is remained in the form of the predetermined pattern.

Under such a condition, as shown in FIG. 8 (B), the photoresist layer 32 is used as a mask and the upper layer 16 is etched for instance, by using the aluminum etchant such as mixed acid.

As a result, the overcoating layer 30 is removed in the state of the predetermined pattern.

Thereafter, all photoresist layers 32 are removed.

As a result, as shown in FIG. 8 (C), the device member 10, in which the gas-impermeable overcoating layer 30 is provided on the sealing layer 20, can be manufactured.

Embodiment 3

As well as the above-mentioned Embodiment 1 and Embodiment 2, the device member 10 comprising the gas-impermeable overcoating layer 30 is manufactured.

That is, as shown in FIG. 2 (A), a device material 1 that includes the SOI (Silicon On Insulator) wafer is prepared. In this case, the device material 1 comprises the substrate member 12 including Si, the interlayer 14 including $SiO_2$ formed on this substrate member 12, and the upper layer 16 including Si formed on the interlayer 14.

This device material 1 is cleaned by using the ammonia hydrogen peroxide water.

Moreover, with the HF solution (diluted to 1/100), the device material 1 is cleaned for one minute.

Moreover, the primer is applied on the upper layer 16 of the device material 1.

In addition, on the surface, as shown in FIG. 2 (B), on the upper layer 16, by using the photoresist "S1805G (brand name)" of the positive type made by SHIPLEY company is used, it is spin-coated under the condition of 4000 rpm/30 sec.

As a result, the photoresist layer 24 is formed.

Next, as shown in FIG. 2 (C), from the upper surface of this resist layer 24, through a photomask 26 having the predetermined pattern, for instance, the photoresist layer 24 is exposed by ultraviolet (UV) for 3 seconds.

Thereafter, it is developed for 1 minute with the developer such as TMAH (Tetra Methyl Ammonium Hydroxide) (developer "NMD-3 (brand name)" manufactured by TOKYO OHKA KOGYO CO., LTD).

As a result, as shown in FIG. 3 (A), the photoresist of the portion exposed is removed, so that the photoresist layer 24 is remained in the form of the predetermined pattern.

Under such a condition, as shown in FIG. 3 (B), the photoresist layer 24 is used as a mask and the upper layer 16 is processed by using the method of Deep Reactive RIE (Deep Reactive Ion Etching).

That is to say, "the process in which the etching by SF6 and the passivation by $C_4F_8$ is alternately are performed", that is called "Process of Bosch" is performed.

As a result, an opening portion 18, which is the same pattern as the photoresist layer 24 remained in the form of the predetermined pattern, is formed to the upper layer 16.

Next, as shown in FIG. 3 (C), all photoresist layers 24 are removed by $O_2$ ashing that uses $O_2$ plasma for 2 minutes.

Moreover, as shown in FIG. 4(A), enclosing material, which includes the photoresist of the negative type "SU-8 (brand name)" made by Microchem company, is spin-coated on the upper layer 16 under the condition of 2000 rpm/sec, so that a gas-permeable sealing layer 20 is formed.

In this case, "SU-8 (brand name)" is originally a liquid, so that "SU-8 (brand name)" is entered into the opening portion 18 by the capillary action of the liquid in the opening portion 18 formed to the upper layer 16 and all part of the opening portion 18 is sealed.

Next, as shown in FIG. 4 (B), "SU-8 (brand name)" is exposed by, for instance, ultraviolet (UV) through photomask 28 having the predetermined pattern for 30 seconds.

Moreover, thereafter, after baking at 95° C. for 3 minutes, it is developed by using, for instance, the developer such as PGMEA (Propylene Glycol Monomethyl Ether Acetate) for 1 minute.

As a result, as shown in FIG. 4 (C), "SU-8 (brand name)", which is the enclosing material of the exposed and baked portion, is remained.

Consequently, the gas-permeable sealing layer 20 is remained in the form of the predetermined pattern.

Under such a condition, as shown by the arrow of FIG. 5, the etching gas, i.e. HF gas is penetrated to the gas-permeable sealing layer 20 for 20 minutes.

As a result, a part of the interlayer 14 is removed, and a cavity 22 is formed in the form of the predetermined pattern.

Next, as shown in FIG. 7 (A), on this gas-permeable sealing layer 20, an overcoating layer 30 of the thickness of 200 nm is formed by using aluminum by vacuum evaporation.

Moreover, the primer is applied on the overcoating layer 30.

In addition, on the surface, as shown in FIG. 7 (B), on the overcoating layer 30, by using the photoresist "S1818G (brand name)" of the positive type made by SHIPLEY company is used, it is spin-coated under the condition of 3000 rpm/30 sec.

As a result, the photoresist layer 32 is formed.

Next, as shown in FIG. 7 (C), from the upper surface of this resist layer 32, through a photomask 34 having the predetermined pattern, the photoresist layer 32 is exposed by ultraviolet (UV) for 3 seconds.

Thereafter, it is developed for 1 minute with the developer such as TMAH (Tetra Methyl Ammonium Hydroxide) (developer "NMD-3 (brand name)" manufactured by TOKYO OHKA KOGYO CO., LTD).

As a result, as shown in FIG. 8 (A), the photoresist of the portion exposed is removed, so that the photoresist layer 32 is remained in the form of the predetermined pattern.

Under such a condition, as shown in FIG. 8 (B), the photoresist layer 32 is used as a mask and the upper layer 16 is etched by using the aluminum etchant (mixed acid aluminum) for 3 minutes.

As a result, the overcoating layer 30 is removed in the form of the predetermined pattern.

Thereafter, all photoresist layers 32 are removed.

As a result, as shown in FIG. 8 (C), the device member 10, in which the gas-impermeable overcoating layer 30 is provided on the sealing layer 20, can be manufactured.

By using this device member 10, it used as a pressure sensor of the absolute pressure type and experiment is performed.

There is a linear correlation between the pressure and the electrostatic capacity.

It is clear that there is the reliability as a pressure sensor.

Although a preferable of the invention is described above, the invention is not limited to this embodiment.

The device member 10 of the invention can be used, for instance, as a micro passage device that is used for the pressure sensor of the capacitance type, the inkjet printer head, the medical treatment, and biotechnology etc.

However, the device member 10 of the invention can be used as various device members.

Therefore, various changes are possible in the scope in which it does not deviate from the object of the invention.

INDUSTRIAL APPLICABILITY

The invention belongs to the technical field of MEMS (Micro Electro Mechanical Systems) and relates to a device member comprising cavity and a method of producing the device member comprising cavity.

The device member, in which such a cavity is provided, can be used, for instance, as a micro passage device that is used for the pressure sensor of the capacitance type, the inkjet printer head, the medical treatment, and biotechnology etc.

EXPLANATION OF LETTERS OR NUMERALS

1
Device material
10
Device member
12
Base member
14
Interlayer
16
Upper layer
18
Opening portion
20
Sealing layer
22
Cavity
24
Photoresist layer
26
Photomask
28
Photomask
30
Overcoating layer
32
Photoresist layer
34
Photomask
50
Pressure sensor
52
Diaphragm
54, 56
Counter electrode
58, 60
Wire
100
Device material
102
Base member
104
Interlayer
106
Upper layer
108
Photoresist layer
110
Photomask
112
Opening portion
114
Gap
116
Sealing layer
118
Cavity
120
Photoresist layer
122
Photomask
200
Pressure sensor
202
Diaphragm
204,206
Counter electrode
208,210
Wire

DRAWING

Figure 9:
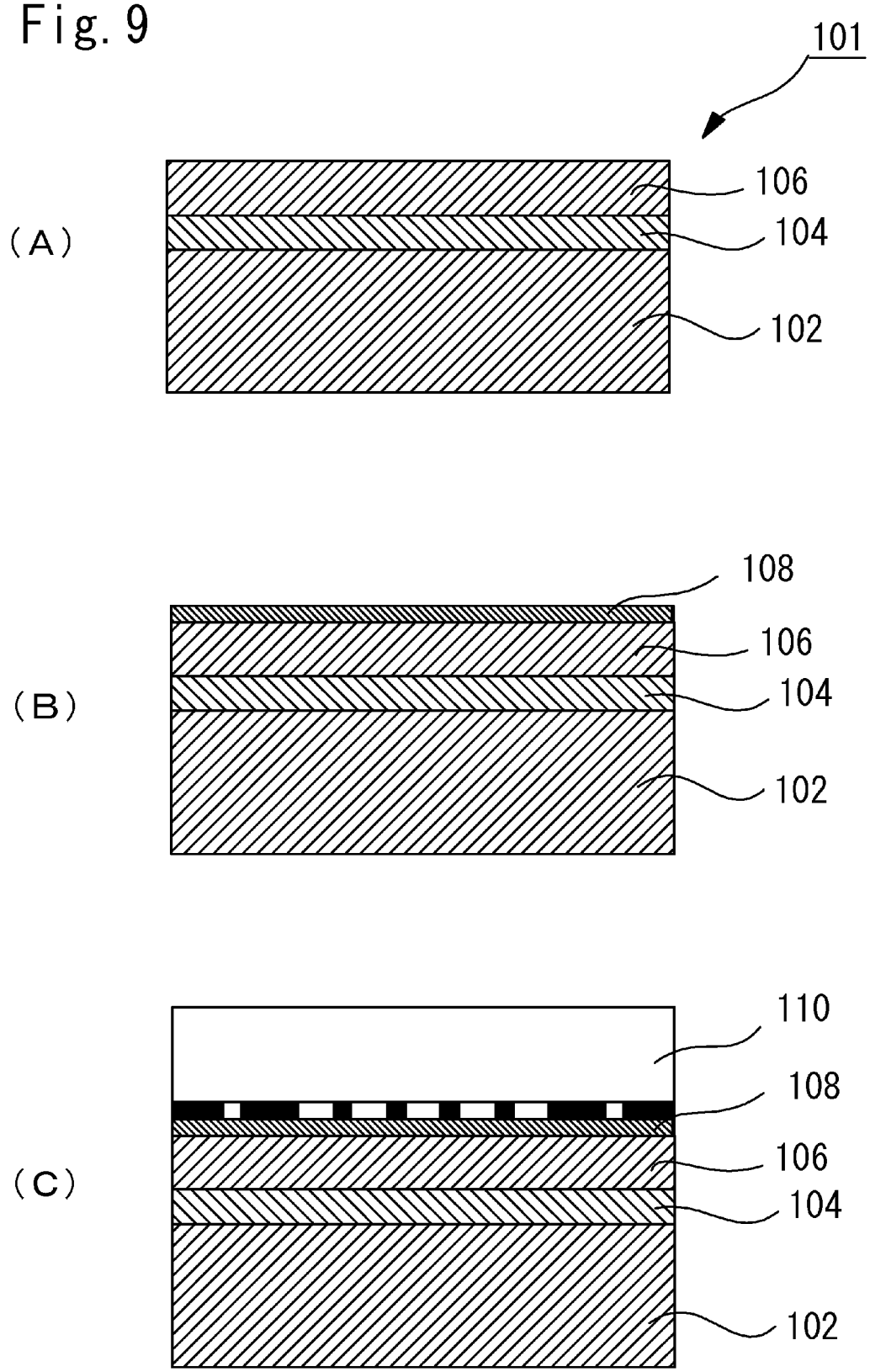
FIG. 9 is a partial enlarged sectional view in which the conventional method of producing the device member comprising the cavity is explained.
Figure 10:
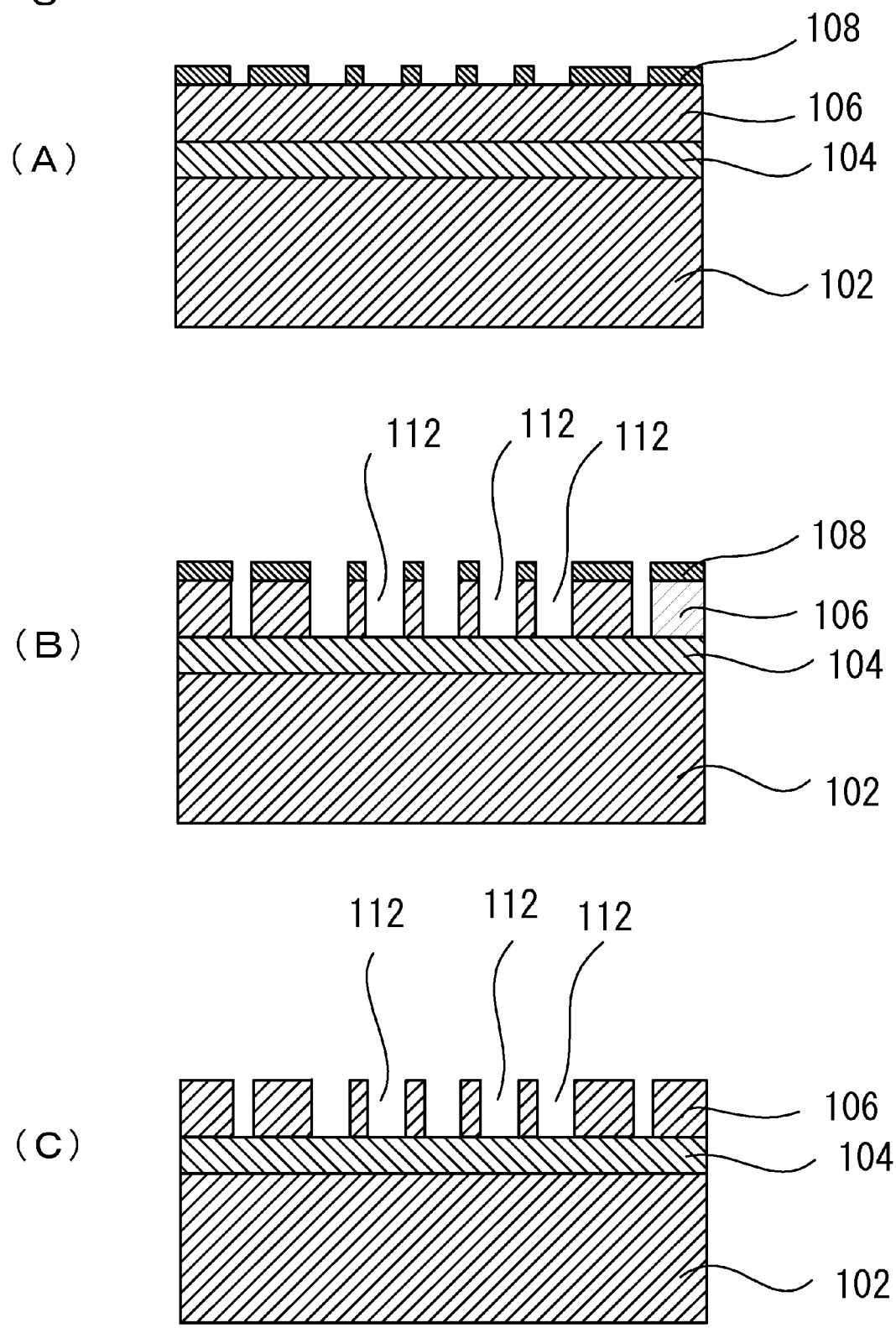
FIG. 10 is a partial enlarged sectional view in which the conventional method of producing the device member comprising the cavity is explained.
Figure 11:
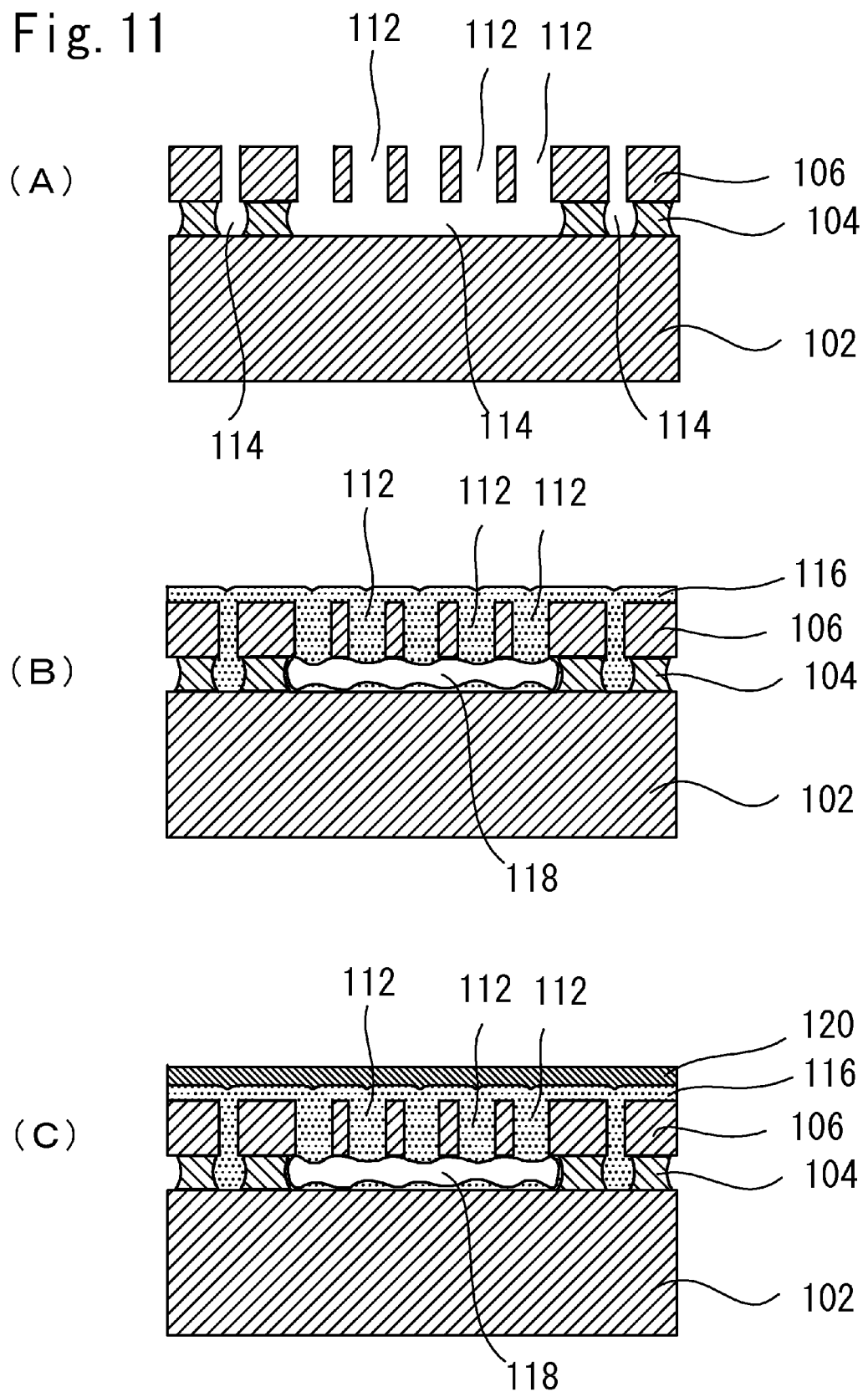
FIG. 11 is a partial enlarged sectional view in which the conventional method of producing the device member comprising the cavity is explained.
Figure 12:
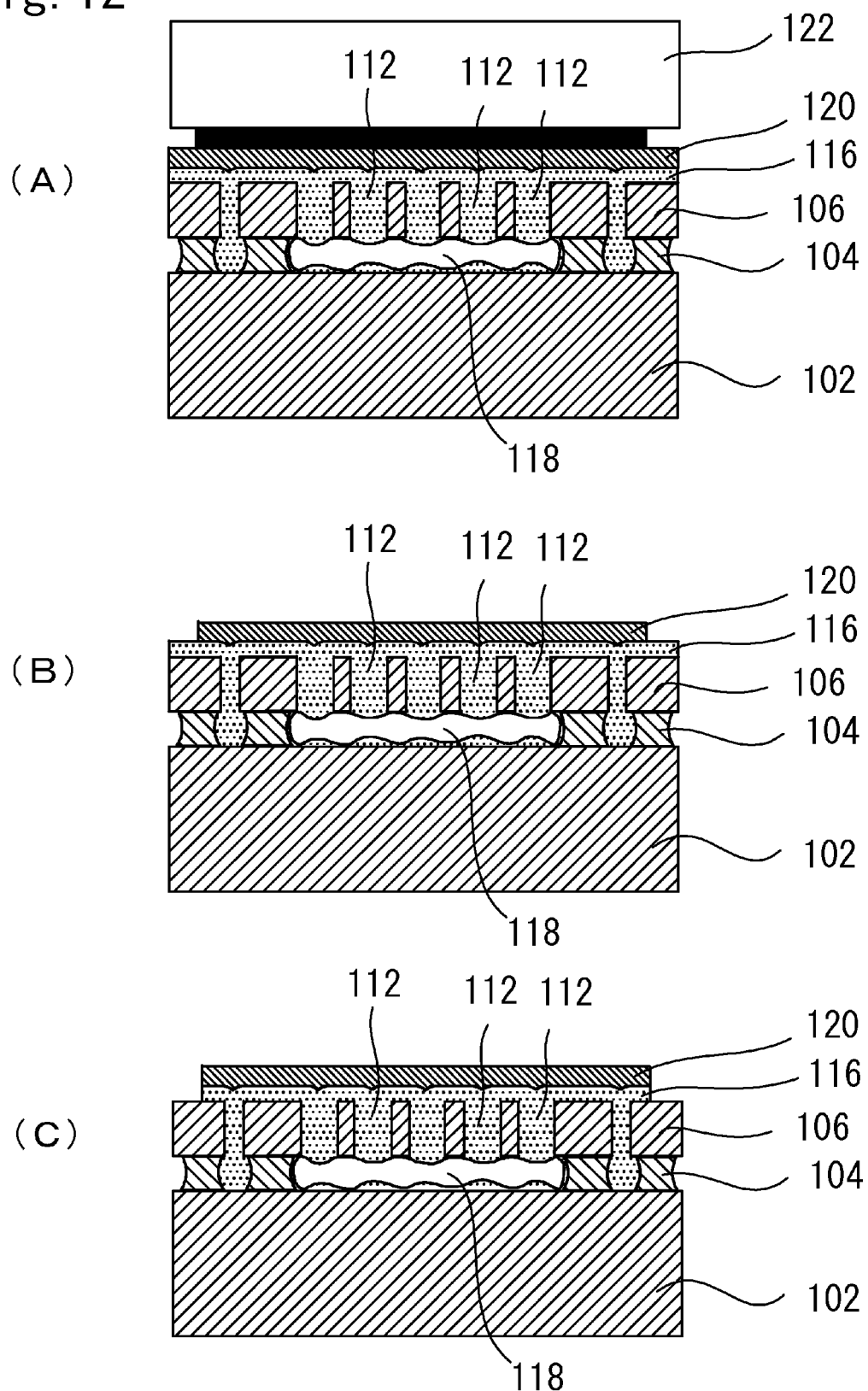
FIG. 12 is a partial enlarged sectional view in which the conventional method of producing the device member comprising the cavity is explained.
Figure 13:
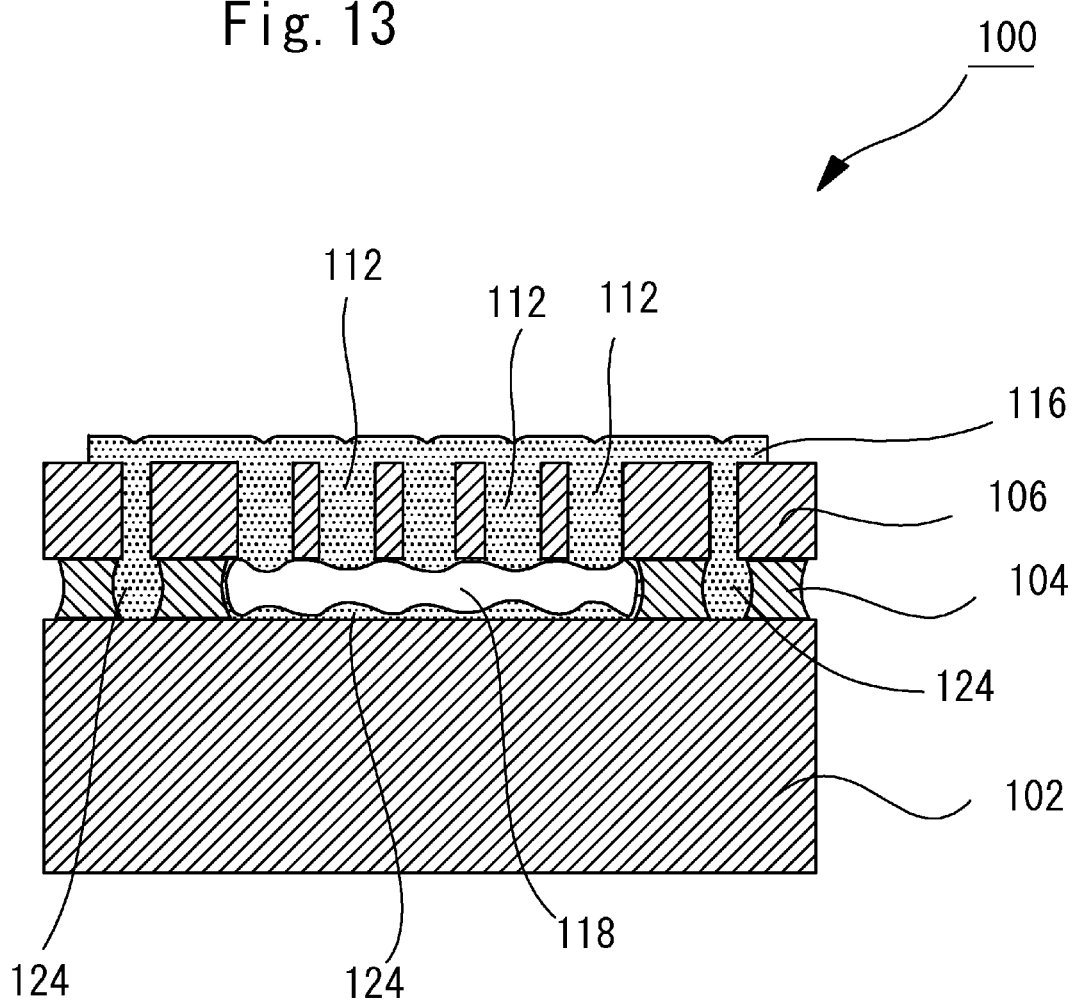
FIG. 13 is a partial enlarged sectional view in which the conventional device member comprising the cavity is explained.

[FIG. 1]
[FIG. 2]
[FIG. 3]
[FIG. 4]
[FIG. 5]
[FIG. 6]
[FIG. 7]
[FIG. 8]
[FIG. 9]
[FIG. 10]
[FIG. 11]
[FIG. 12]
[FIG. 13]
[FIG. 14]
[FIG. 15]

The invention claimed is:

1. A device member including a cavity, comprising:
a base member including a first semiconductor;

an interlayer, which is formed on the base member and is non-conductive;

an upper layer, which is formed on the interlayer and includes a second semiconductor;

an opening portion formed at the upper layer; and a gas-permeable sealing layer, which is formed to seal the opening portion formed at the upper layer;

wherein the cavity is formed by removing the interlayer with an etching gas that penetrates through the gas-permeable sealing layer.

2. The device member of claim 1, wherein a gas-impermeable overcoating layer is disposed on the sealing layer.

3. The device member of claim 2, wherein the cavity is in a state of a vacuum.

4. The device member of claim 1, wherein the base member is Si, the interlayer is $SiO_2$, and the upper layer is Si.

5. A capacitance type of pressure sensor, comprising a device member including a cavity, the device member including:

a base member including a first semiconductor, an interlayer, which is formed on the base member and is non-conductive, an upper layer, which is formed on the interlayer and includes a second semiconductor, an opening portion formed at the upper layer, and a gas-permeable sealing layer, which is formed to seal the opening portion formed at the upper layer, wherein the cavity is formed by removing the interlayer with an etching gas that penetrates through the gas-permeable sealing layer.

6. A method of producing a device member including a cavity, comprising:

providing a device material, the device material comprising, a base member including a first semiconductor, an interlayer which is formed on the base member and is non-conductive, and an upper layer which is formed on the interlayer and includes a second semiconductor;

forming an opening portion at the upper layer;

sealing the opening portion, which is formed at the upper layer, with a gas-permeable sealing layer; and forming the cavity by removing the interlayer using an etching gas that penetrates through the gas-permeable sealing layer.

7. The method of claim 6, further comprising: forming a gas-impermeable overcoating layer.

8. The method of claim 7, wherein forming the gas-impermeable overcoating layer is performed under a vacuum condition so that the cavity is in a state of a vacuum.

9. The method of claim 6, wherein the device member is an SOI (Silicon On Insulator) wafer, in which the base member is Si, the interlayer is $SiO_2$, and the upper layer is Si.

10. A capacitance type of pressure sensor, comprising a device member including a cavity, wherein the device member is produced by a method including:

providing a device material, the device material comprising, a base member including a first semiconductor, an interlayer which is formed on the base member and is non-conductive, and an upper layer which is formed on the interlayer and includes a second semiconductor;

forming an opening portion at the upper layer;

sealing the opening portion which is formed at the upper layer with a gas-permeable sealing layer; and forming the cavity by removing the interlayer using an etching gas that penetrates through the gas-permeable sealing layer.

11. The pressure sensor of claim 5, wherein a gas-impermeable overcoating layer is disposed on the sealing layer.

12. The pressure sensor of claim 11, wherein the cavity is in a state of a vacuum.

13. The pressure sensor of claim 5, wherein the base member is Si, the interlayer is $SiO_2$, and the upper layer is Si.

14. The pressure sensor of claim 10, wherein the method further comprises forming a gas-impermeable overcoating layer.

15. The pressure sensor of claim 14, wherein forming the gas-impermeable overcoating layer is performed under a vacuum condition so that the cavity is in a state of a vacuum.

16. The pressure sensor of claim 10, wherein the device member is an SOI (Silicon On Insulator) wafer, in which the base member is Si, the interlayer is $SiO_2$, and the upper layer is Si.

* * * * *